(12) United States Patent
Ikeda et al.

(10) Patent No.: US 7,579,205 B2
(45) Date of Patent: *Aug. 25, 2009

(54) METHOD OF FABRICATING LIGHT EMITTING DEVICE AND THUS-FABRICATED LIGHT EMITTING DEVICE

(75) Inventors: Hitoshi Ikeda, Annaka (JP); Kingo Suzuki, Annaka (JP); Akio Nakamura, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 126 days.

This patent is subject to a terminal disclaimer.

(21) Appl. No.: 11/587,635

(22) PCT Filed: Apr. 13, 2005

(86) PCT No.: PCT/JP2005/007166

§ 371 (c)(1),
(2), (4) Date: Oct. 26, 2006

(87) PCT Pub. No.: WO2005/106975

PCT Pub. Date: Nov. 10, 2005

(65) Prior Publication Data

US 2008/0061307 A1 Mar. 13, 2008

(30) Foreign Application Priority Data

Apr. 27, 2004 (JP) ............................. 2004-131806

(51) Int. Cl.
*H01L 21/00* (2006.01)

(52) U.S. Cl. ............................ 438/46; 438/964; 438/33; 438/22; 438/47; 257/E33.003

(58) Field of Classification Search .................. 438/22, 438/33, 46, 47; 257/E33.003
See application file for complete search history.

(56) References Cited

U.S. PATENT DOCUMENTS

| 4,554,006 A | * | 11/1985 | Buschmann et al. | ........ 548/578 |
| 4,554,046 A | * | 11/1985 | Taguchi et al. | .............. 438/746 |
| 5,414,281 A | * | 5/1995 | Watabe et al. | ................. 257/95 |
| 5,453,629 A | * | 9/1995 | Gofuku et al. | ............. 257/186 |
| 5,713,828 A | * | 2/1998 | Coniglione | .................... 600/7 |

(Continued)

FOREIGN PATENT DOCUMENTS

EP         1061590         12/2000

(Continued)

*Primary Examiner*—Charles D. Garber
*Assistant Examiner*—Pape Sene
(74) *Attorney, Agent, or Firm*—Oliff & Berridge, PLC

(57) ABSTRACT

A light emitting device wafer having a light emitting layer section 24 having an AlGaInP-base double heterostructure, and a GaP light extraction layer 20 disposed on the light emitting layer section so as to allow a first main surface thereof to compose a first main surface of the wafer is fabricated so that the first main surface of the GaP light extraction layer appears as the (100) surface. The first main surface of the GaP light extraction layer 20 composed of the (100) surface is etched using an etching solution for surface roughening to thereby form surface roughening projections 40*f*. Accordingly, there can be provided a method of fabricating a light emitting device having the GaP light extraction layer agreed with the (100) main surface, capable of readily subjecting the (100) main surface to surface roughening.

9 Claims, 22 Drawing Sheets

U.S. PATENT DOCUMENTS

| | | |
|---|---|---|
| 5,770,714 A * | 6/1998 | Agabian et al. ............. 536/23.1 |
| 5,898,192 A * | 4/1999 | Gerner ........................ 257/98 |
| 5,923,053 A * | 7/1999 | Jakowetz et al. .............. 257/95 |
| 6,277,665 B1 * | 8/2001 | Ma et al. ....................... 438/46 |
| 6,395,572 B1 | 5/2002 | Tsutsui et al. |
| 6,531,405 B1 * | 3/2003 | Wegleiter et al. ........... 438/745 |
| 6,586,773 B2 * | 7/2003 | Saeki et al. ................... 257/86 |
| 6,704,888 B1 * | 3/2004 | Caudrelier et al. ............ 714/37 |
| 6,791,117 B2 | 9/2004 | Yoshitake et al. |
| 6,921,924 B2 * | 7/2005 | Tsai et al. ..................... 257/95 |
| 7,037,738 B2 | 5/2006 | Sugiyama et al. |
| 7,211,834 B2 * | 5/2007 | Sunachi et al. ................ 257/99 |
| 2002/0011600 A1 * | 1/2002 | Kurahashi et al. ............. 257/88 |
| 2003/0047745 A1 | 3/2003 | Suzuki et al. |
| 2003/0132445 A1 | 7/2003 | Yoshitake et al. |
| 2003/0173568 A1 * | 9/2003 | Asakawa et al. .............. 257/79 |
| 2003/0178626 A1 | 9/2003 | Sugiyama et al. |
| 2003/0197191 A1 | 10/2003 | Nitta et al. |
| 2004/0026700 A1 * | 2/2004 | Akaike et al. ................. 257/79 |
| 2004/0104395 A1 * | 6/2004 | Hagimoto et al. ............. 257/79 |
| 2007/0224714 A1 * | 9/2007 | Ikeda et al. ................... 438/26 |

FOREIGN PATENT DOCUMENTS

| | | |
|---|---|---|
| JP | 5-190896 | 7/1993 |
| JP | 8-115893 | 5/1996 |
| JP | 11-251629 | 9/1999 |
| JP | 2000-196141 | 7/2000 |
| JP | 2000-299494 | 10/2000 |
| JP | 2001-196630 | 7/2001 |
| JP | 2003-209283 | 7/2003 |
| JP | 2003-218383 | 7/2003 |

* cited by examiner $\beta = 70.5°$
$\phi = 54.7°$ $\beta = 109.4°$
$\phi = 35.3°$ $\phi 0 = \phi 1 = \phi 2 (=55°)$ $\theta$ : OFF-ANGLE $\phi 1' > \phi 2'$
$\phi 1' = \phi 0 + \theta$
$\phi 2' = \phi 0 - \theta$

FIG.10

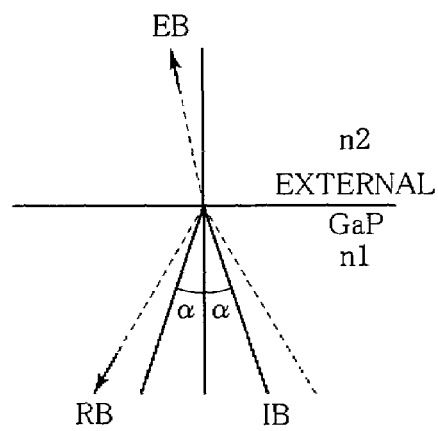

$\alpha$ : CRITICAL ANGLE OF TOTAL REFLECTION $$\alpha = \mathrm{Sin}^{-1}\left(\frac{n2}{n1}\right)$$

n2 : REFRACTIVE INDEX OF SURROUNDING MEDIUM n1 : REFRACTIVE INDEX OF GaP ($\simeq 3.45$)

SURROUNDED BY AIR   $n2 \fallingdotseq 1$
$\alpha = 16.8°$
SURROUNDED BY EPOXY RESIN   $n2 \fallingdotseq 1.6$
$\alpha = 27.6°$

FIG.11

MAIN LIGHT EXTRACTION AREA

ESCAPE CONE

ESCAPE CONE

POINT LIGHT SOURCE

SIDE-FACE LIGHT EXTRACTION AREAS

FIG.15
STEP 1
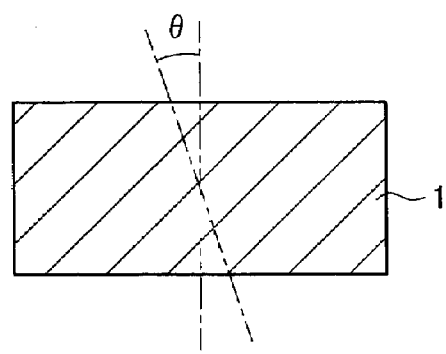
STEP 2
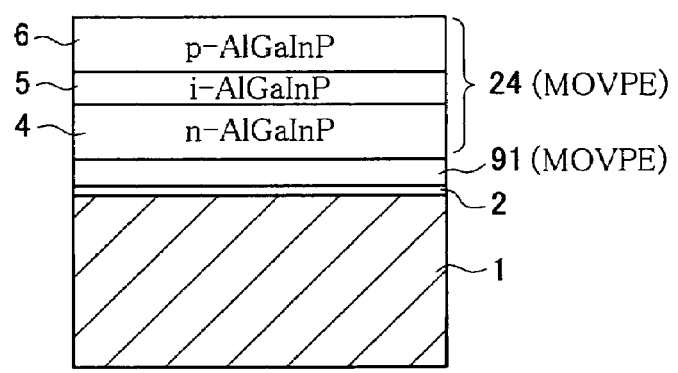

FIG.16
STEP 3
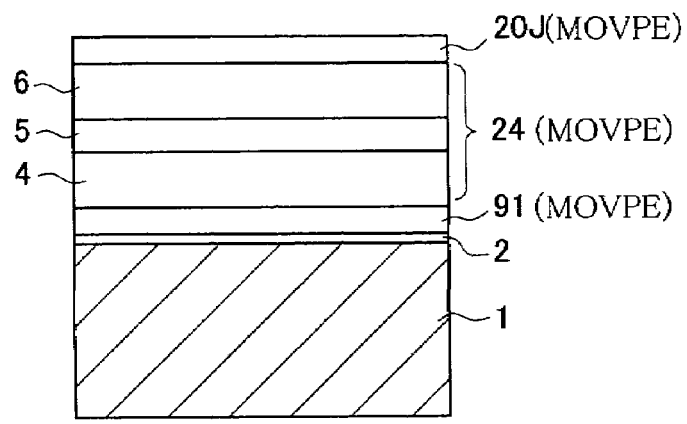
STEP 4
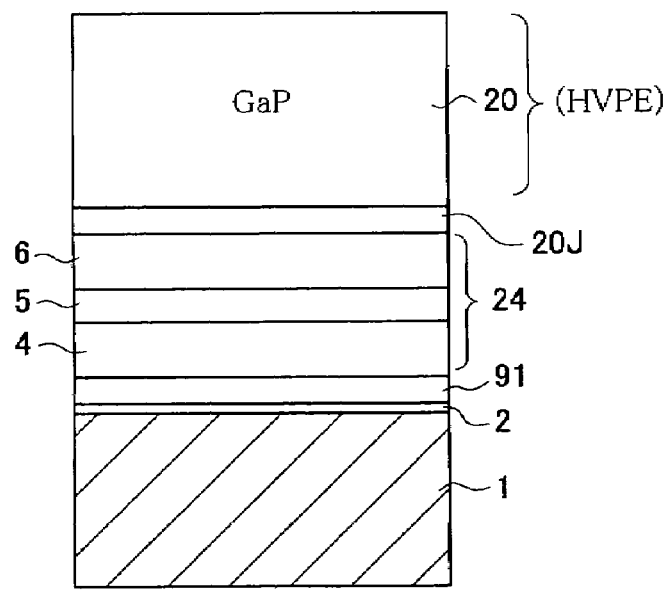

FIG.17
STEP 5
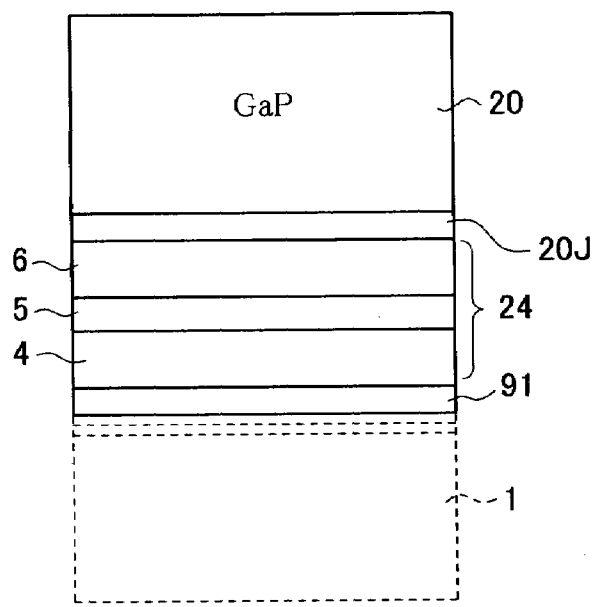
STEP 6
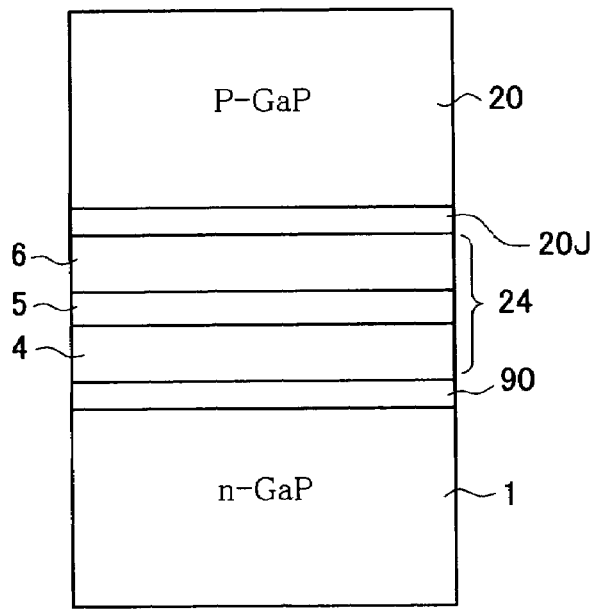

METHOD OF FABRICATING LIGHT EMITTING DEVICE AND THUS-FABRICATED LIGHT EMITTING DEVICE

RELATED APPLICATIONS

This application claims the priority of Japanese Patent Application No. 2004-131806 filed on Apr. 27, 2004, which is incorporated herein by reference.

BACKGROUND OF THE INVENTION

1. Field of the Invention

This invention relates to a method of fabricating a light emitting device and thus-fabricated light emitting device.

2. Description of the Related Art

Light emitting device having a light emitting layer section thereof composed of an $(Al_xGa_{1-x})_yIn_{1-y}P$ alloy (where, $0 \leq x \leq 1$, $0 \leq y \leq 1$; simply referred to as AlGaInP alloy, or more simply as AlGaInP, hereinafter) can be realized as a high-luminance device over a wide wavelength range typically from green region to red region, by adopting a double heterostructure in which a thin AlGaInP active layer is sandwiched between an n-type AlGaInP cladding layer and a p-type AlGaInP cladding layer, both having a larger band gap. Current is supplied to the light emitting layer section through a metal electrode formed on the surface of the device. The metal electrode acts as a light interceptor, so that it is formed, for example, so as to cover only the center portion of a first main surface of the light emitting layer section, to thereby extract light from the peripheral region having no electrode formed thereon.

In this case, a smaller area of the metal electrode is advantageous in terms of improving the light extraction efficiency, because it can ensure a larger area for the light leakage region formed around the electrode. Conventional efforts have been made on increasing the energy of light extraction by effectively spreading current within the device through consideration on geometry of the electrode, but increase in the electrode area is inevitable anyhow in this case, having been fallen in a dilemma that a smaller light extraction area results in a limited energy of light extraction. Another problem resides in that the current is less likely to spread in the in-plane direction, because the dopant carrier concentration, and consequently the conductivity ratio, of the cladding layer is suppressed to a slightly lower level in order to optimize emissive recombination of carriers in the active layer. This results in concentration of the current into the region covered by the electrode, and consequently lowers the substantial energy of light extraction from the light leakage region. There has been adopted a method of forming, between the cladding layer and the electrode, a low-resistivity GaP light extraction layer having a dopant concentration larger than that of the cladding layer. The GaP light extraction layer increased in the thickness to a certain degree is not only successful in improving the in-plane current spreading effect, but also in increasing extractable energy of light from the side faces of the layer to thereby raise the light extraction efficiency. It is necessary for the light extraction layer to be formed using a material having a band gap energy larger than a light quantum energy of the beam of emitted light, for the purpose of efficient transmission of the beam of emitted light and raising the light extraction efficiency. In particular, GaP is widely used for composing the light extraction layer of AlGaInP-base light emitting device, by virtue of its large band gap energy and small absorption of the beam of emitted light.

In thus-configured light emitting device using the peripheral region of the metal electrode on the first main surface of the light extraction layer as the light extraction area, not all components of the emitted light directed from inside of the device towards the light extraction area can be extracted, because some components incident on the light extraction area at an angle (angle of incidence herein means an angle of the direction of incidence of beam away from the normal line on the area) larger than the critical angle returns back inside the device by total reflection. Japanese Laid-Open Patent Publication "Tokkai" Nos. 2003-218383 and 2003-209283 disclose techniques of roughening (also referred to as frosting) the first main surface of the light extraction layer using an appropriate etching solution so as to form fine irregularities, aiming at reducing probability of incidence of the beam of emitted light at large angles and at consequently raising the light extraction efficiency.

Japanese Laid-Open Patent Publication "Tokkai" No. 2003-218383, however, discloses that the surface roughening using the etching solution can roughen some surfaces but cannot roughen other surfaces depending on orientation of the exposed surface, and is therefore not always effective in terms of upper surface roughening, so that improvement in the light extraction efficiency is achievable only to a limited degree, and further improvement in the luminance is not easy. Japanese Laid-Open Patent Publication "Tokkai" No. 2003-209283 more specifically discloses that "the main surface of semiconductor substrate generally shows the (100) surface or a surface several degrees off-angled from the (100) surface, so that the surface of any of the individual semiconductor layers grown thereon has also the (100) surface or a surface several degrees off-angled from the (100) surface, wherein it is difficult to roughen the (100) surface and the surface several degrees off-angled from the (100) surface". The light extraction layer disclosed in Japanese Laid-Open Patent Publication "Tokkai" No. 2003-209283 is a GaAlAs layer, whereas Japanese Laid-Open Patent Publication "Tokkai" No. 2003-218383 discloses a GaP light extraction layer, having again the (100) surface exposed on the first main surface thereof.

Putting all aspects disclosed in Japanese Laid-Open Patent Publication "Tokkai" Nos. 2003-218383 and 2003-209283 together, it is obvious that the GaP light extraction layer having the (100) surface on the first main surface thereof cannot be roughened simply by immersing it into the etching solution, so far as any publicly-known etching solution for GaP (hydrochloric acid, sulfuric acid, hydrogen peroxide or mixed solutions of these components, according to paragraph 0026 in Japanese Laid-Open Patent Publication "Tokkai" No. 2003-218383) is used as the etching solution, and that it is difficult to form the irregularities capable of improving the light extraction efficiency to a sufficient degree.

Japanese Laid-Open Patent Publication "Tokkai" No. 2003-218383 discloses, as one specific solution of this problem, a method of etching the (100) main surface of the GaP light extraction layer, after covering it with a finely-patterned resin mask. Although Japanese Laid-Open Patent Publication "Tokkai" No. 2003-218383 also formally suggests wet etching (chemical etching) as the etching method, all specific disclosures including the embodiments are made only on dry etching based on RIE (reactive ion etching) which costs high, and is disadvantageous in terms of its extremely low process efficiency, because only a small area of substrate can be processed at a time. As far as the present inventors investigated, it is also supposed that the chemical etching using hydrochloric acid, sulfuric acid, hydrogen peroxide, or any mixed solution of these components causes a considerable intrusion of the etching under the mask, and therefore cannot form the distinct irregularities on the GaP light extraction layer as shown in Japanese Laid-Open Patent Publication "Tokkai" No. 2003-209283.

On the other hand, Japanese Laid-Open Patent Publication "Tokkai" No. 2003-209283 gives no specific information on the formation of the irregularities by etching the (100) main surface of the GaP light extraction layer, because the light extraction surface herein is composed of GaAlAs. A method adopted herein is such as forming a macroscopic secondary trench pattern having a triangle section by mechanical processing so as to expose the (111) surface allowing the etching to proceed thereon more smoothly, and subjecting the surface of the secondary pattern to chemical etching. The method is, however, disadvantageous in that the number of process steps increases corresponding to necessity of the mechanical processing for forming the trenches.

The light emitting device having the GaP light extraction layer can increase the energy of light extractable from the side faces of the GaP light extraction layer, if the layer is thickened. Therefore the light extraction efficiency of the device as a whole can further be increased by roughening also the side faces of thus-thickened GaP light extraction layer. The methods of surface roughening described in Japanese Laid-Open Patent Publication "Tokkai" Nos. 2003-218383 and 2003-209283, however, essentially need process steps of forming the mask and the trenches, which are permissible only on the main surface of the wafer, and this consequently raises a critical disadvantage in that the surface roughening is not adoptable to the side faces of the chip which appear only after the wafer is diced. In particular in the dry etching such as RIE as described in Japanese Laid-Open Patent Publication "Tokkai" No. 2003-218383, it may be absolutely impossible to etch the side faces by allowing the etching beam, directed straightforward to the main surface of the layer, to come round onto the side faces, due to strong directionality of the etching beam.

It is therefore a subject of this invention to provide a method of fabricating a light emitting device, having a GaP light extraction layer having the (100) surface as the main surface thereof, capable of readily roughening the (100) main surface, and a light emitting device having an excellent light extraction efficiency realizable only by this method.

SUMMARY OF THE INVENTION

Aiming at solving the above-described subject, a method of fabricating a light emitting device according to this invention is such as having:

a light emitting device wafer fabricating step fabricating a light emitting device wafer having a light emitting layer section based on a double heterostructure in which a first-conductivity-type cladding layer, an active layer and an second-conductivity-type cladding layer, each of which being composed of a compound semiconductor having a composition allowing lattice matching with GaAs, out of compound semiconductors expressed by formula $(Al_xGa_{1-x})_yIn_{1-y}P$ (where, $0 \leq x \leq 1$, $0 \leq y \leq 1$), are stacked in this order, and a GaP light extraction layer disposed on the light emitting layer section so as to allow a first main surface thereof to compose a first main surface of the wafer, so that the first main surface of the GaP light extraction layer appears as the (100) surface;

a main light extraction area roughening step forming surface roughening projections on the first main surface of the GaP light extraction layer composed of the (100) surface, by etching the surface using an etching solution for surface roughening containing acetic acid, hydrofluoric acid, nitric acid, iodine and water up to a total content of 90% by mass or more, and having a total content by mass of acetic acid, hydrofluoric acid, nitric acid and iodine larger than the content by mass of water; and a dicing step dicing the light emitting device wafer to thereby fabricate light emitting device chips each having the surface roughening projections on the first main surface of the GaP light extraction layer.

According to the method of this invention using the invention-specific etching solution for surface roughening containing acetic acid, hydrofluoric acid, nitric acid and iodine, formation of irregularities based on the principle of anisotropic etching can proceed in a distinctive manner on the first main surface of the GaP light extraction layer composed of the (100) surface, simply by allowing the first main surface to contact with the etching solution, without special need of masking or the like, and thereby the surface roughening projections can be formed on the first main surface of the GaP light extraction layer in an efficient and inexpensive manner. The total content of acetic acid, hydrofluoric acid, nitric acid, iodine and water is 90% by mass or more, wherein any content lower than this value fails in efficiently forming the surface roughening projections. The total content of acetic acid, hydrofluoric acid, nitric acid and iodine smaller than the content of water also similarly results in inefficient formation of the surface roughening projections. The residual portion remaining after subtracting the total content of acetic acid, hydrofluoric acid, nitric acid, iodine and water from 100% by mass may be occupied by other components (carboxylic acid other than acetic acid, for example), so far as the anisotropic etching effect with respect to GaP on the (100) surface is not impaired.

"A compound semiconductor allowing lattice matching with GaAs" in this invention means a compound semiconductor having a ratio of lattice mismatching expressed by $\{|a1-a0|/a0\} \times 100(\%)$ fallen within an 1% range, where a1 is a lattice constant of the compound semiconductor expected for the bulk crystal state having no stress-induced lattice displacement produced therein, and a0 is a lattice constant of GaAs in the same state. "A compound semiconductor having a composition allowing lattice matching with GaAs, out of compound semiconductors expressed by formula $(Al_{x'}Ga_{1-x'})_{y'}In_{1-y'}P$ (where, $0 \leq x' \leq 1$, $0 \leq y' \leq 1$)" will be referred typically to as "AlGaInP lattice-matched to GaAs". The active layer may be configured as a single AlGaInP layer, or as a quantum well layer having barrier layers and well layers, differed in the AlGaInP composition from each other, alternately stacked therein (quantum well layers as a whole is assumed as a single active layer).

The fact that the (100) surface appears on the first main surface of the GaP light extraction layer means, in a narrow sense, that the principal crystal axis of the GaP light extraction layer is agreed with the [100] direction of GaP crystal, whereas it is to be understood in this invention that also inclination of the principal crystal axis up to 25° or smaller (more preferably 15° or smaller; and 1° or larger in view of intensifying the effect of off-angle) away from the [100] direction (that is, provision of off-angle) will be included in the concept of "the (100) surface appears on the first main surface of the GaP light extraction layer". Although the first main surface in this case will have a higher order of surface index in a strict sense, the paragraphs below may denote the first main surface off-angled from the (100) surface as $(100)_{OFF}$, and the first main surface agreed with the (100) surface as $(100)_J$, as the occasion demands so as to avoid complexity in the explanation. It is also to be understood that any preferable surfaces adopted herein expressed by the Miller index $\{hkl\}$ represent surfaces inclined 1° to 25°, both ends inclusive, away from the exact $\{hkl\}_J$ surface will be represented by the index, unless otherwise specifically be noted, and the notation $\{hkl\}_{OFF}$ will be used if discrimination is necessary.

In order to enable formation of the surface roughening projections by chemical etching on the surface of a compound semiconductor single crystal having no crystal boundary, it is necessary for the etching solution employed herein to exhibit larger etchrate on a crystal surface having a specific orientation than on crystal surfaces having other orientations (the surface advantageous for the etching will be referred to as "predominantly-etchable surface", hereinafter), that is, to enable anisotropic etching dependent on surface orientation. Crystal surface obtained after allowing anisotropic etching to proceed thereon shows a combination of several predominantly-etchable surfaces differed in the surface index but equivalent in terms of crystallography, and therefore produces irregularity ascribable to the geometry specific to the crystal structure. GaP based on the cubic system has the surfaces which belong to the {111} group showing the closest packing as the predominantly-etchable surface. Assuming that also the surface having the inverse sign as the identical surfaces, the {111} group is now understood as including four surfaces differed in the orientation, so that the surface roughening based on anisotropic etching tends to produce pyramid-like irregularities based on combination of these surfaces.

The first main surface of the GaP light extraction layer adopted in this invention appears as the (100) surface largely inclined (approximately 55° for the exact (100) surface) from the predominantly-etchable (111) surface, and can allow the formation of irregularities to distinctively proceed thereon, if the predominantly-etchable surface can selectively be exposed in the initial stage of the etching. The etching solution for surface roughening adopted in this invention not only shows a large etchrate to a certain degree on the (100) surface of GaP, but also shows an etchrate on the (111) surface appropriately differed therefrom, and consequently has a large effect of forming the irregularities while allowing the (111) surface to selectively expose. The chemical etching solution disclosed in Japanese Laid-Open Patent Publication "Tokkai" No. 2003-218383 (hydrochloric acid, sulfuric acid, hydrogen peroxide or mixed solutions of these components) is unsuccessful in appropriately forming the surface roughening projections on the (100) surface, supposedly because the solution shows only an extremely small etchrate on the (100) surface so that the etching hardly proceeds from its early stage, or conversely the etchrate on the (100) surface is too close to the etchrate on the (111) surface, so that the {111} group cannot distinctively be exposed even under progress of the etching.

It is preferable to adopt the etching solution such as containing:

acetic acid (on $CH_3COOH$ basis): 37.4% by mass or more and 94.8% by mass or less;

hydrofluoric acid (on HF basis): 0.4% by mass or more and 14.8% by mass or less;

nitric acid (on $HNO_3$ basis): 1.3% by mass or more and 14.7% by mass or less; and iodine (on $I_2$ basis): 0.12% by mass or more and 0.84% by mass or less, and has a water content of 2.4% by mass or more and 45% by mass or less. Any of these components out of the above-defined ranges results in insufficient effect of anisotropic etching on the (100) surface of GaP single crystal, and thereby results in only insufficient formation of the surface roughening projections on the first main surface of the GaP light extraction layer. The surface roughening etching solution more preferably adoptable is such as containing:

acetic acid (on $CH_3COOH$ basis): 45.8% by mass or more and 94.8% by mass or less;

hydrofluoric acid (on HF basis): 0.5% by mass or more and 14.8% by mass or less;

nitric acid (on $HNO_3$ basis): 1.6% by mass or more and 14.7% by mass or less; and iodine (on $I_2$ basis): 0.15% by mass or more and 0.84% by mass or less, and has a water content of 2.4% by mass or more and 32.7% by mass or less. In other words, in view of raising the anisotropic etching effect on the (100) surface of GaP single crystal, it can be said as important to suppress the water content to a low level as described in the above, and to allow acetic acid, rather than water, to function as a main acidic solvent.

For the case where the GaP light extraction layer is formed to as thick as 10 µm or more in the method of this invention, it is allowable to additionally carry out a side-face light extraction area roughening step forming surface roughening projections on the side-face light extraction areas of the GaP light extraction layer composed of the side faces of the chips formed by the dicing, by etching the areas using the etching solution for surface roughening.

A light emitting device of this invention can be realized only by the above-described method, characterized in having:

a light emitting layer section based on a double heterostructure in which a first-conductivity-type cladding layer, an active layer and an second-conductivity-type cladding layer, each of which being composed of a compound semiconductor having a composition allowing lattice matching with GaAs, out of compound semiconductors expressed by formula $(Al_xGa_{1-x})_yIn_{1-y}P$ (where, $0 \leq x \leq 1$, $0 \leq y \leq 1$), stacked in this order; and a GaP light extraction layer having a thickness of 10 µm or more, formed on the first main surface side of the light emitting layer section, having a part of a first main surface thereof covered with a light-extraction-side electrode, allowing an area of the first main surface not covered by the light-extraction-side electrode to function as a main light extraction area, and allowing the side face areas to similarly function as side-face light extraction areas, wherein the GaP light extraction layer is a GaP single crystal layer having the (100) surface as the first main surface, and has surface roughening projections formed by etching on both of the main light extraction area and the side-face light extraction areas.

The fact that the surface roughening projections can be formed on the GaP light extraction layer by virtue of the anisotropic etching effect simply by immersing the layer into an etching solution means that the surface roughening projections can readily be formed also on the side faces of the GaP light extraction layer on which the mask formation and the trench formation, described in Japanese Laid-Open Patent Publication Nos. 2003-218383 and 2003-209283, are intrinsically not available. In particular for the case where the GaP light extraction layer is formed to as thick as 10 µm or more, formation of the surface roughening projections on the side faces thereof can considerably raise the light extraction efficiency of the device, synergistically with an effect of increase in the side face area by virtue of increase in the thickness of the GaP light extraction layer. This effect is said to be never achievable by the conventional techniques disclosed in Japanese Laid-Open Patent Publication Nos. 2003-218383 and 2003-209283. In view of raising the light extraction efficiency from the side faces of the GaP light extraction layer, it is more preferable to adjust the thickness of the GaP light extraction layer to 40 μm or more (the upper limit is set to 200 μm, for example).

The outer surfaces of the surface roughening projections can be formed mainly as having the {111} surfaces by chemical anisotropic etching of GaP single crystal. Taking the large anisotropic etching effect of the etching solution for surface roughening into account, the surface roughening projections in particular in the main light extraction area of the GaP light extraction layer can be formed by immersing the entire surface of a flat crystalline main surface, composed of the (100) surface, of the GaP single crystal into an etching solution for surface roughening (that is, without forming any etching mask on the main crystal surface composed of the (100) surface, or without forming any trenches for exposing the {111} surfaces), and this procedure can largely simplify the process steps, and can sufficiently enhance the light extraction efficiency. The surface roughening projections can readily be formed also on the side-face light extraction areas by immersing the side faces of the layer into the etching solution for surface roughening.

FIG. 10 is a drawing schematically explaining a concept of extraction of incident beam from the GaP light extraction layer. Assuming the refractive index of the GaP light extraction layer as n1 (3.45 or around), and the refractive index of a surrounding medium as n2, incident beam IB causes total reflection on the light extraction surface when the angle of incidence (angle away from the normal line on the surface) of the incident beam IB with respect to the light extraction surface of the GaP light extraction layer reaches and exceeds a critical angle $\alpha$, and returns back into the device as reflected beam RB. The reflected beam can escape out to the external of the layer as extracted beam EB, only when the angle of incidence becomes smaller than the critical angle $\alpha$ after repeating internal reflection. It is, however, highly probable that a considerable energy of the incident beam is lost during this process, due to absorption and scattering inside the crystal. The critical angle $\alpha$ is considerably as small as approximately 16.8° when the surrounding medium is composed of the air (n2≈1), and only as much as approximately 27.6° even if an epoxy resin mold (n2≈1.6) is used. Out of all components of incident beam incident on one point on the light extraction surface, the components extractable out to the external without causing total reflection are limited to those fallen inside a cone obtained by rotating, around the normal line drawn through the point, a generatrix inclined at an angle $\alpha$ away from the normal line. The cone is also referred to as an extraction cone.

On the other hand, when the light emitting layer section is understood as a collective of a large number of point light sources arrayed in plane as shown in FIG. 11, beam of light from each of the point light sources is emitted as spreading omni-directionally. Assuming now the normal line drawn from each point light source down onto the light extraction surface, it is geometrically obvious that any components of the beam of light emitted at angles not smaller than $\alpha$, away from the normal line, will cause angle of incidence again not smaller than $\alpha$ on the light extraction surface, so far as the surface is a flat plane, so that the light returns back into the layer by total reflection. Accordingly, as for the main light extraction area and the side-face light extraction areas of the GaP light extraction layer, we can assume similar circular cones having the point light source at the apex thereof, around the normal line drawn from the point light source down onto the individual areas, so far as the surface is a flat plane. Of all components of incident beam directed from each point light source towards the individual areas, the components extractable out to the external are limited to those fallen inside the circular cones (the circular cones are referred to as escape cones). On the other hand, formation of the surface roughening projections on the light extraction area can largely increase the ratio of extractable beam of light incident at low angles, when considered on the basis of substantial angle of incidence on the irregularities, and can also increase the surface area of that area by virtue of the irregularities, so that even components of the beam of light fallen outside the escape cones now become extractable in an effective manner from the planar area.

Critical angle $\alpha$ of total reflection is a determinant of the apex angle of the extraction cone (or escape cone), wherein the angle $\alpha$ is as small as 17 to 27° at most as described in the above. By considering the fact that dimensional spreading of the GaP light extraction layer is far larger in the in-plane direction than in the thickness-wise direction, it is obvious that the ratio of area sectioned by the extraction cones standing on the point light sources in the main light extraction area becomes scarce, so that a large portion of the components of the incident light fall outside the extraction cones, and are therefore not extractable out to the external. The main light extraction area, therefore, shows an extremely distinctive effect of improving the light extraction efficiency, by virtue of formation of the surface roughening projections.

The side-face light extraction areas have only an extremely small degree of extension of the surface in the thickness-wise direction as compared with the main light extraction area, so that the extraction cones arrayed in the plane of the layer overlap with each other, and this makes the ratio of area sectioned by the extraction cones standing on the point light sources dense, and also makes all of four side faces, differing in the orientation, available as the light extraction areas. As a consequence, the side-face light extraction areas can achieve a sufficient level of improvement in the light extraction efficiency, even if the thoroughness of formation of the roughening projections is moderate than in the main light extraction area. In other words, the surface roughening projections formed on the side-face light extraction areas of the GaP light extraction layer may be formed as satisfying at least either one of conditions that they have a smaller mean height, and that they have a larger mean interval of formation, as compared with those of the surface roughening projections formed in the main light extraction area. This configuration can therefore simplify the process of formation of the surface roughening projections in the side-face light extraction areas, raise efficiency in the manufacturing, and reduce the cost.

The side-face light extraction areas tends to cause residue of mechanical distortions or crystal defects if they are formed by dicing or cleavage of the light emitting device wafer, and is therefore less likely to proceed thereon the formation of irregularities by chemical etching as compared with the main light extraction area. The thoroughness of formation of the surface roughening projections on the side-face light extraction areas moderated as described in the above is more advantageous in terms of simplifying the formation process of the irregularities in the side-face light extraction areas.

If the orientation of the side-face areas of the GaP light extraction layer is agreed with the {110} surface, which is a cleavage plane of GaP single crystal (allowing a degree of shift of 1° to 25°, both ends inclusive, away from the exact {110} direction, for the case where the off-angle is given as described in the above), combination of half-dicing of the wafer and breaking based on cleavage can simplify the separation process for producing the chips, and can also contribute to improvement in the production yield of the light emitting device, because nonconformities such as cracking in undesired directions and chipping of the chips are less likely to occur. Even in the process of full-dicing of the wafer for separation into chips, agreement of the dicing plane with the cleavage plane can improve the production yield, because the load of the dicing can be suppressed to a low level, wherein also the chipping is less likely to occur. Aiming at full exhibition of the above-described advantages, it has been a fixed idea for III-V compound semiconductor devices having the zincblende structure, but not limited to the light emitting device within a scope of this invention, to adjust the direction of dicing to the <110> direction when they are manufactured by dicing wafers having the (100) main surface (also simply referred to as (100) wafer, hereinafter) as shown in FIG. 23. For example, Japanese Laid-Open Patent Publication "Tokkaihei" No. 8-115893 discloses a method of fabricating a light emitting device, involving dicing of a (100) wafer in parallel with the orientation flat, wherein the orientation flat of the (100) wafer is generally formed in parallel with the {110} surface, so that the dicing direction described in Japanese Laid-Open Patent Publication "Tokkaihei" No. 8-115893 is in the <110> direction.

The surface roughening projections formed by the anisotropic etching are, however, formed as having a basic form of regular octahedron surrounded by the {111} surfaces, and shows on the {110} surface, as shown in FIG. 6, a flattened geometry such that the regular octahedron is vertically split by a plane containing the axial line, proving intrinsic difficulty in forming deeply-profiled irregularities by anisotropic etching. Crystal defects such as dislocation caused by mechanical processing are likely to distribute along the cleavage plane, so that the surfaces exposed by the cleavage and/or dicing tend to have a relatively large density of residual dislocations or the like, and this further retards the chemical etching. For this reason, it is unconditional in some cases that the thoroughness of formation of the surface roughening projection on the side-face light extraction areas composed of the {110} surface is substantially moderated. Another problem resides in that the AlGaInP light emitting layer section and the GaP light extraction layer tend to produce therebetween mismatch-induced stress due to difference in the lattice constants, so that dicing along the {110} surface, which is a cleavage plane, is likely to cause laminar cracks along the cleavage plane (and consequently the chip edge) under mismatch-inducing stress, and may even result in failures such as chipping of the chip edge or the like as shown in the lower part of FIG. 23.

The present inventors then made extensive investigations, to finally find out that all of the above-described nonconformities can be resolved if the light emitting device, having the GaP light extraction layer formed on the AlGaInP light emitting layer section, is manufacture by dicing while allowing the {100} surface to appear on the side faces thereof, as shown in FIG. 4. In other words, by avoiding agreement between the dicing surface and the cleavage plane, any cleaving cracks even if accidentally produced will appear in the direction crossing the chip edge as shown in the lower part of FIG. 4, and thereby the failures ascribable to chipping and the like can largely be suppressed. Thus-obtained light emitting device in this case is configured as having the side-face areas of the GaP light extraction layer, composed of the {100} surface of GaP single crystal.

When the side face composed of the {100} surface is further subjected to anisotropic etching using the above-described etching solution, geometry of the surface roughening projections formed in the side-face light extraction areas shows a pyramid-like form as shown in FIG. 5, similarly to as obtained in the main light extraction area composed of the (100) surface, allowing formation of far deeper-profiled irregularities as compared with the embodiment shown in FIG. 6 where the {110} surfaces appear on the side faces, and this raises an additional advantage of considerably improving the light extraction efficiency from the side faces.

Any excessive residue of the process-induced damage layer formed in the side-face light extraction areas of the GaP light extraction layer after the dicing not only inhibits smooth formation of the surface roughening projections by the succeeding chemical etching, but also allows a part of the process-induced damage layer to remain even after the formation of the surface roughening projections, possibly causative of absorption or scattering of the beam of emitted light. It is therefore effective to etch off, after the dicing, the process-induced damage layer formed in the side-face light extraction areas of the GaP light extraction layer, using a damage-removing solution composed of an aqueous sulfuric acid/hydrogen peroxide solution, and then to further etch it using an etching solution for surface roughening. The aqueous sulfuric acid/hydrogen peroxide solution is excellent in the effect of uniformly etching GaP crystal including the process-induced damage layer, so that the process-induced damage layer in the side-face light extraction areas can thoroughly be removed prior to the etching for surface roughening, and thereby the formation of the surface roughening projections can be promoted, and residue of the process-induced damage layer can be suppressed.

The surface roughening projections formed using the above-described etching solution for surface roughening can be obtained in various forms, by adjusting composition of the etching solution and etching conditions (etching temperature and time). For example, the surface roughening projections can be rounded to have curved surfaces on the end portion side thereof. This geometry is obtained in a relatively early stage of the anisotropic etching proceeded on the GaP (100) surface using the above-described etching solution for surface roughening, and can enhance the light extraction efficiency, because the angle of incidence can be suppressed relatively small anywhere on thus-rounded curved surface. This effect is further enhanced when each of the surface roughening projections has a main body composing the projection base and thinned towards the end side thereof, and a swelled tip portion integrated with the main body, as being swelled out in a ball form on the end side thereof.

The surface roughening projections may be formed also as having a basic geometry obtained by anisotropic etching, and by further rounding it using an isotropic etching solution. By this process, the outer surface of the surface roughening projections can have a convex curved surface more closer to a spherical form, and thereby the light extraction efficiency can further be improved.

A plurality of the surface roughening projections, formed as being distributed on the main light extraction area, may be configured as having a polyhedral form with a plurality of planes surrounding the outer surface of at least the projection bases, wherein the majority of the projections are formed as having both of $\phi 1$ and $\phi 2$ of 30° or more, satisfying $\phi 1 > \phi 2$, where $\phi 1$ and $\phi 2$ are acute angles respectively held between each of two opposing surfaces of the same projection and the first main surface of the GaP light extraction layer in a predetermined direction on the main light extraction area. Use of anisotropic etching is more likely to produce a polyhedral geometry (for example, polyhedral pyramid) based on a combination of predominant etching surfaces differing in the surface index (more specifically, {111} surfaces), on the outer surface of the projection (especially on the outer surface of the main body composing the base side thereof). Adjustment of both of ϕ1 and ϕ2, which are acute angles respectively held between each of two opposing surfaces of the same projection and the first main surface of the GaP light extraction layer in the above-described predetermined direction, to 30° or more successfully enhances an effect of reducing the incident angle of beam of light, and contributes to improvement in the light extraction efficiency. The light extraction efficiency further improves by intentionally making difference between one angle ϕ1 and the other angle ϕ2 as described in the above.

It is now possible to configure the GaP light extraction layer as a single crystal substrate bonded to the light emitting layer section. In this case, the GaP light extraction layer can readily be formed, by stacking the GaP single crystal substrate on the light emitting layer section, and annealing the stack at relatively low temperatures ranging from 100° C. to 700° C., both ends inclusive, to thereby bond the single crystal substrate directly to the light emitting layer section. On the other hand, the GaP light extraction layer can be configured also as being epitaxially grown on the light emitting layer section by the vapor phase growth method (for example, hydride vapor phase epitaxial growth method: referred to as HVPE method hereinafter).

For the case where the AlGaInP light emitting layer section is grown by the MOVPE method, provision of an appropriate off-angle to a growth-assisting GaAs substrate can considerably reduce ordering and maldistribution of the Group III elements, and can yield the light emitting device having a uniform emission spectral profile and center wavelength. Formation of the GaP light extraction layer composed of a III-V compound semiconductor by the HVPE method, on the alloy-base light emitting layer section grown by the MOVPE method, scarcely produces, on the finally-obtained GaP light extraction layer, facets and roughened surface ascribable to the off-angle of the GaAs substrate, and thereby yields the GaP light extraction layer excellent in the smoothness. This effect is particularly distinctive when the off-angle falls within the range from 10° to 20°, both ends inclusive.

For the case where the light emitting layer section is such as being epitaxially grown on the GaAs substrate having the principal axis thereof 1° to 25°, both ends inclusive, off-angled from the <100> direction, it is preferable to make the crystal orientation of the GaP light extraction layer agree with thus off-angled light emitting layer section. Disagreement of the crystal orientation between the light emitting layer section and the GaP light extraction layer may impair ohmic contact between both layers, and may undesirably increase the forward voltage of the light emitting device. The GaP light extraction layer formed by the vapor phase growth process inevitably has the crystal orientation agreed with the crystal orientation of the light emitting layer section, whereas for the case where the layer is formed by bonding the single crystal substrate, also the single crystal substrate used herein is preferably added with the same off-angle in the same direction as the light emitting layer section.

When the light emitting layer section and the GaP light extraction layer are such as those epitaxially grown on the GaAs substrate having the principal axis thereof 1° to 25°, both ends inclusive, off-angled from the <100> direction as described in the above, anisotropic etching of the main light extraction area of the GaP light extraction layer using the above-described etching solution for surface roughening forms the projections composed based on a combination of the {111} surfaces as being inclined, because the first main surface of the GaP light extraction layer composing the main light extraction area inclines by off-angle degrees away from the $(100)_J$ surface. In short, the projections satisfying the above-described condition ϕ1>ϕ2 can be obtained in an extremely easy manner. Assuming now that a direction connecting the exact [100] axis and the off-angled principal crystal axis as the above-described predetermined direction, and that angles held between the outer surfaces of the projection composed of two {111} surfaces opposing in this direction and the first main surface of thus off-angled GaP light extraction layer as ϕ1 and ϕ2, provision of an off-angle up to 25° never makes the smaller angle ϕ2 fall below 30°, because the angle held between the (111) surface and the (100) surface is approximately 55°. On the other hand, the larger angle ϕ1 may be as large as 80° or around, ensuring a steep-rising surface.

The reason why a projection 40f satisfying ϕ1>ϕ2 can improve the light extraction efficiency as compared with the projection satisfying ϕ1=ϕ2 can be supposed as below. As shown in FIG. 9, a projection satisfying ϕ1=ϕ2 on the $(100)_J$ surface allows setting of an above-described extraction cone EC1 on an arbitrary point on the projection. Light incident on the extraction cone EC1 gives extracted beam EB, wherein it is assumed now that the light is reflected on the opposite surface to come into the extraction cone EC1, and the incident beam IB on the reflection surface comes into the projection 40f after crossing the base surface $(100)_J$ having the projection 40f formed thereon. In order to obtain the incident beam IB as the reflected beam coming into the extraction cone EC1, it is optically necessary for the incident beam IB to fall within a virtual extraction cone EC2 which is symmetrical with the surface of the extraction cone EC1. Therefore, a problem of finding a condition allowing extraction of light through the surface of the above-described projection 40f can geometrically be considered as a problem of finding an allowable range of the incident beam IB on the base surface $(100)_J$.

The condition is that the incident beam IB falls within the extraction cone EC2, so that on the base surface $(100)_J$, an area S0 sectioned by the extraction cone EC2 can be understood as an area allowing extraction of the incident beam. When the base surface is inclined to have the surface $(100)_{OFF}$ due to an off-angle θ, because of a principle of anisotropic etching the projection 40f and consequently the extraction cone EC2 incline at θ away from the surface $(100)_{OFF}$, while keeping the orientation with respect to the surface $(100)_J$ unchanged. The area sectioned by the extraction cone EC2 then changes from S0 on the surface $(100)_J$ into S1 on the surface $(100)_{OFF}$. It is geometrically obvious that the sectioned area becomes almost minimum (S0) on the surface $(100)_J$ having the projection 40f upright thereon, and that the size of area (S1) on the base surface inclined by the off-angle becomes larger than S0. In other words, the allowable range allowing the incident beam to escape from a certain point on the surface of the projection 40f becomes larger in the latter case, and this consequently contributes to improvement in the light extraction efficiency. It is to be noted that the same effect will be obtained when the off-angle θ is set upward with respect to the surface $(100)_J$, although shown in FIG. 9 as being set downward.

BRIEF DESCRIPTION OF THE DRAWINGS

FIG. 10 is a drawing explaining critical angle for total reflection;

FIG. 11 is a drawing explaining difference in the light extraction effect between the main light extraction area and the side-face light extraction areas;

FIG. 15 is a drawing explaining process steps of fabricating the light emitting device shown in FIG. 1;

FIG. 16 is a drawing explaining process steps as continued from FIG. 15;

FIG. 17 is a drawing explaining process steps as continued from FIG. 16;

BEST MODES FOR CARRYING OUT THE INVENTION

Paragraphs below will describe embodiments of this invention referring to the attached drawings.

Figure 1:
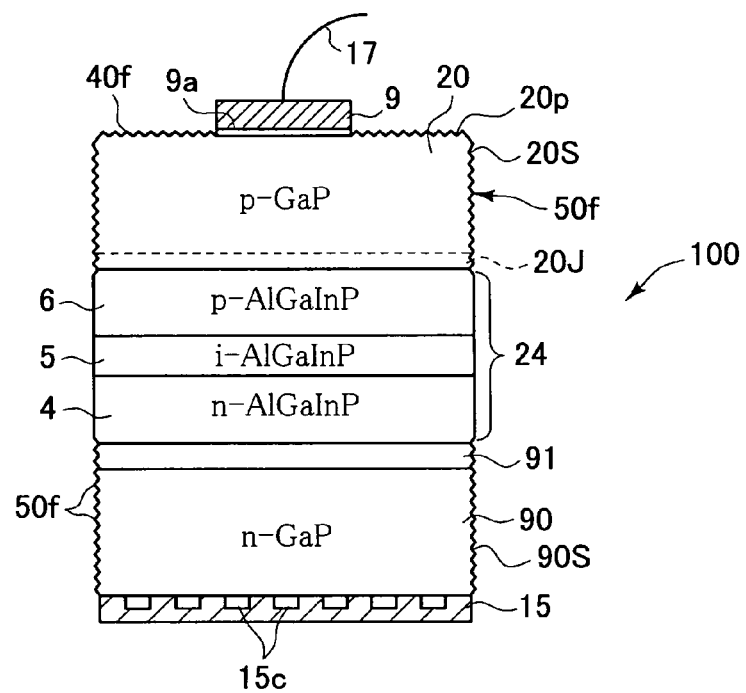
FIG. 1 is a schematic drawing showing a sectional side elevation of an exemplary light emitting device of this invention.

FIG. 1 is a conceptual drawing of a light emitting device 100 as one embodiment of this invention. The light emitting device 100 has a light emitting layer section 24 composed of a III-V compound semiconductor, and a GaP light extraction layer 20 (p-type herein) formed on a first main surface side of the light emitting layer section 24. On a second main surface side of the light emitting layer section 24, a GaP transparent substrate 90 is disposed. In this embodiment, a chip of the light emitting device 100 has a plain geometry of 300 μm square.

The light emitting layer section 24 has a structure in which an active layer 5 composed of a non-doped $(Al_xGa_{1-x})_yIn_{1-y}P$ alloy (where, $0 \leq x \leq 0.55$, $0.45 \leq y \leq 0.55$) is held between a p-type cladding layer (first-conductivity-type cladding layer) 6 composed of a p-type $(Al_zGa_{1-z})_yIn_{1-y}P$ alloy (where, $x<z\leq1$), and an n-type cladding layer (second-conductivity-type cladding layer) 4 composed of an n-type $(Al_zGa_{1-z})_yIn_{1-y}P$ alloy (where, $x<z\leq1$). The light emitting device 100 shown in FIG. 1 has the p-type AlGaInP cladding layer 6 disposed on the first main surface side (upper side in the drawing), and has the n-type AlGaInP cladding layer 4 disposed on the second main surface side (lower side in the drawing). It is to be noted that "non-doped" in the context herein means "not intentionally added with a dopant", and never excludes possibility of any dopant components inevitably included in the normal fabrication process (up to $1\times10^{13}$ to $1\times10^{16}$/cm$^3$ or around, for example). The light emitting layer section 24 is grown by the MOVPE method. Thickness of each of the n-type cladding layer 4 and the p-type cladding layer 6 is typically 0.8 μm to 4 μm (more preferably 0.8 μm to 2 μm), both ends inclusive, and thickness of the active layer 5 is typically 0.4 μm to 2 μm (more preferably 0.4 μm to 1 μm), both ends inclusive. Total thickness of the light emitting layer section 24 as a whole is typically 2 μm to 10 μm (more preferably 2 μm to 5 μm), both ends inclusive.

Figure 2:
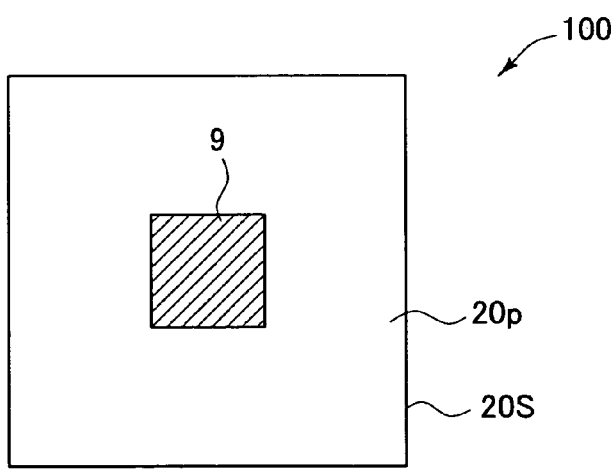
FIG. 2 is a schematic plan view of the same.

The GaP light extraction layer 20 is formed to as thick as 10 μm to 200 μm (more preferably 40 μm to 200 μm: typically 100 μm in this embodiment), both ends inclusive, and as shown in FIG. 2, a light-extraction-area-side metal electrode 9 is formed so as to cover a part (center portion herein) of the first main surface thereof. The light-extraction-area-side metal electrode 9 is connected with one end of an electrode wire 17. The peripheral area around the light-extraction-area-side metal electrode 9 forms a main light extraction area 20p. The side faces of the GaP light extraction layer 20 form side-face light extraction areas 20S. The GaP light extraction layer 20 formed to as thick as described in the above allows emission drive current, based on current supply through the light-extraction-area-side metal electrode 9, to spread in-plane over the device, to thereby function as a current spreading layer assisting in-plane uniform emission of the light emitting layer section 24, and also takes part in increasing beam of light extractable from the side faces of the layer, to thereby function as raising the luminance of the device as a whole (integrating sphere). GaP has a band gap energy larger than that of AlGaInP composing the active layer 5, and is desirably suppressed in absorption of the emission beam.

The GaP light extraction layer 20 in this embodiment is grown by the HVPE method (MOVPE method also allowable). Between the GaP light extraction layer 20 and the light emitting layer section 24, a connection layer 20J composed of a GaP layer is formed, as being continued from the light emitting layer section 24 by the MOVPE method. The connection layer 20J herein may be composed of an AlGaInP layer capable of gradually changing difference in the lattice constants (and consequently alloy composition) between the light emitting layer section 24 composed of AlGaInP and the GaP light extraction layer 20. The GaP light extraction layer 20 may be formed also by bonding of a GaP single crystal substrate, in place of being formed as an epitaxially-grown layer by the HVPE method.

The GaP transparent substrate 90 is formed by bonding a GaP single crystal substrate (an epitaxially-grown layer obtained by the HVPE method also allowable: reference numeral 91 represents a connection layer composed of AlGaInP), and the entire range of the second main surface is covered with a back electrode 15 composed of an Au electrode or the like. The crystal orientation of the GaP transparent substrate 90 is agreed with that of the light emitting layer section 24 (that is, degrees of the off-angle coincide). Thickness of the GaP transparent substrate 90 is typically 10 μm to 200 μm, both ends inclusive. The back electrode 15 also functions as a reflective layer for the beam of light coming from the light emitting layer section 24 through the GaP transparent substrate 90, and contributes to improvement in the light extraction efficiency. Between the back electrode 15 and the GaP transparent substrate 90, a bond-assisting alloyed layer 15c composed of an AuBe alloy or the like, for reducing contact resistance between the both, is formed as being distributed according to a dot pattern. The bond-assisting alloyed layer 15c slightly lowers its reflectivity as alloying with a compound semiconductor layer composing the GaP transparent substrate 90 proceeds, so that the layer is formed as being distributed according to a dot pattern, so as to allow the background area to function as a direct reflection surface composed of a high-reflectivity back electrode 15. On the other hand, a bond-assisting alloyed layer 9a composed of an AuGeNi alloy or the like is formed between the light-extraction-area-side metal electrode 9 and the GaP light extraction layer 20. Both of the GaP light extraction layer 20 and the GaP transparent substrate 90 are respectively adjusted to have a dopant concentration of $5\times10^{16}/cm^3$ to $2\times10^{18}/cm^3$ (dopant concentration herein is defined excluding any high-concentration doped region for raising contact resistance, occasionally formed directly under the bond-assisting alloyed layer 9a).

Figure 3:
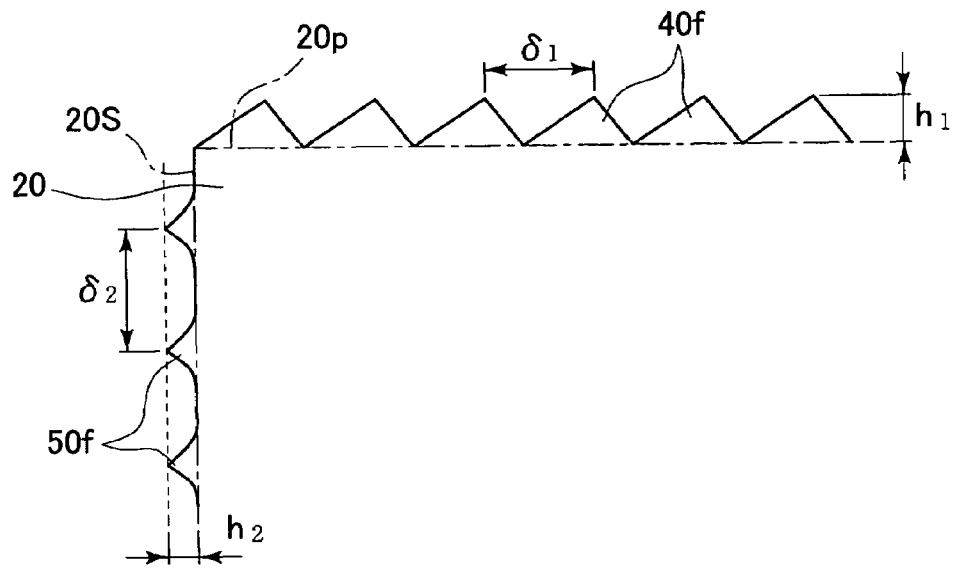
FIG. 3 is a conceptual drawing of the surface roughening projections formed on the GaP light extraction layer shown in FIG. 1.

The GaP light extraction layer 20 has, as shown in FIG. 3, surface roughening projections 40f, 50f formed by chemical etching on the main light extraction area 20p and on the side-face light extraction areas 20S, respectively. The main light extraction area (first main surface) 20p of the GaP light extraction layer 20 has a base plane, obtained by leveling the irregularities, as being approximately agreed with the (100) surface of the GaP light extraction layer 20 (where, off-angle of 1° to 25°, and 15° in this embodiment, is provided as described later), and the surface roughening projections 40f are formed by bringing the flat (100) principal crystal surface into contact with an etching solution for surface roughening described later so as to proceed anisotropic etching. Also the side-face light extraction areas 20S are nearly agreed with the {100} surfaces, and the surface roughening projections 50f are formed similarly by anisotropic etching. By forming the surface roughening projections 40f, 50f, the light emitting device 100 is largely improved in the light extraction efficiency, synergistically with an effect of increase in the side face area by virtue of increase in the thickness of the GaP light extraction layer 20.

The outer surfaces of projection composing the surface roughening projections 40f, 50f are formed by chemical anisotropic etching of GaP single crystal, as being mainly composed of the {111} surfaces (50% or more of the total surface of the projections). The surface roughening projections 40f, 50f have a mean height of 0.1 μm to 5 μm, both ends inclusive, and a mean interval of formation of the projections of 0.1 μm to 10 μm, both ends inclusive. In the side-face light extraction areas 20S, thoroughness of formation of the surface roughening projections 50f is moderated as compared in the main light extraction area 20p. More specifically, the surface roughening projections 50f formed in the side-face light extraction areas 20S satisfy at least either one of conditions that they have a smaller mean height as compared with that of the surface roughening projections 40f formed in the main light extraction area 20p (h2<h1 in FIG. 3), and that they have a larger mean interval of formation (δ2>δ1 in FIG. 3). This configuration can further simplify the process of formation of the surface roughening projections 50f on the side-face light extraction areas 20S, raise efficiency in the manufacturing, and reduce the cost.

Paragraphs below will describe a method of fabricating the light emitting device 100 shown in FIG. 1.

First as shown in STEP 1 of FIG. 15, an n-type GaAs single crystal substrate 1, having an off-angle θ of 1° to 25°, both ends inclusive, (15° in this embodiment) is obtained as a growth-assisting substrate. Next, as shown in STEP 2, an n-type GaAs buffer layer 2 of typically 0.5 μm thick is epitaxially grown on the main surface of the substrate 1, and further thereon, as the light emitting layer section 24, the n-type cladding layer 4 of 1 μm thick (n-type dopant is Si), the active layer (non-doped) 5 of 0.6 μm thick, and the p-type cladding layer 6 of 1 μm thick (p-type dopant is Mg: also C derived from organo-metallic molecules can be contributive as the p-type dopant), respectively composed of an $(Al_xGa_{1-x})_yIn_{1-y}P$ alloy are epitaxially grown in this order. The dopant concentrations of the p-type cladding layer 6 and the n-type cladding layer 4 typically fall in the range from $1\times10^{17}/cm^3$ to $2\times10^{18}/cm^3$, both ends inclusive. Further on the p-type cladding layer 6, the connection layer 20J is epitaxially grown as shown in STEP 3 of FIG. 16.

The above-described individual layers are epitaxially grown by any publicly-known MOVPE method. Source gases available as sources of the individual components Al, Ga, In (indium) and P (phosphorus) include the followings:

Al source gas: trimethyl aluminum (TMAl), triethyl aluminum (TEAl), etc.;

Ga source gas: trimethyl gallium (TMGa), triethyl gallium (TEGa), etc.;

In source gas: trimethyl indium (TMIn), triethyl indium (TEIn), etc.; and

P source gas: trimethyl phosphorus (TMP), triethyl phosphorus (TEP), phosphine ($PH_3$), etc.

The process then advances to STEP 4 in FIG. 16, wherein the GaP light extraction layer 20 composed of p-type GaP is grown by the HVPE method. The HVPE method is specifically proceeded so that Ga as a Group III element is heated and kept at a predetermined temperature in a vessel, and hydrogen chloride is introduced over Ga to thereby produce GaCl through a reaction expressed by the formula (1) below, and is then supplied over the substrate together with $H_2$ gas as a carrier gas:

$$Ga(l)+HCl(g) \rightarrow GaCl(g)+\tfrac{1}{2}H_2 \quad (1)$$

The growth temperature is typically set to 640° C. to 860° C., both ends inclusive, wherein P as a Group V element is supplied on the substrate in a form of $PH_3$, together with $H_2$ as a carrier gas. Zn as a p-type dopant is supplied in a form of DMZn (dimethyl Zn). GaCl is excellent in reactivity with $PH_3$, and can efficiently grow the GaP light extraction layer 20 according to the reaction expressed by the formula (2) below:

$$GaCl(g)+PH_3(g) \rightarrow GaP(s)+HCl(g)+H_2(g) \quad (2)$$

After completion of the growth of the GaP light extraction layer 20, the process advances to STEP 5 in FIG. 17, wherein the GaAs substrate 1 is removed by chemical etching using an etching solution such as an ammonia/hydrogen peroxide mixed solution. On the second main surface side of the light emitting layer section 24 (second main surface of a connection layer 91), from which the GaAs substrate 1 has already been removed, a separately-obtained, n-type GaP single crystal substrate is bonded to thereby obtain the GaP transparent substrate 90 (STEP 6).

Figure 18:
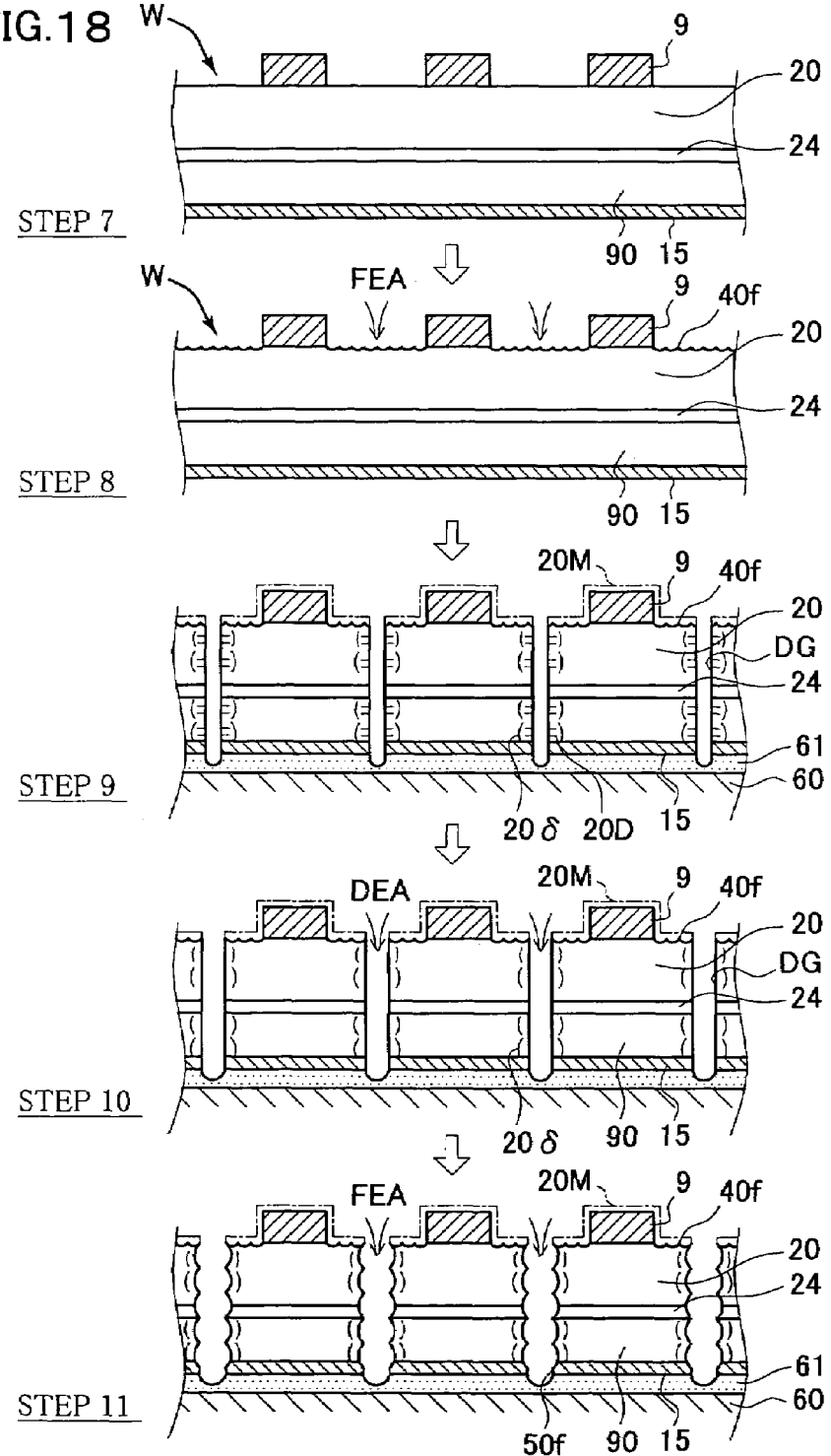
FIG. 18 is a drawing explaining process steps as continued from FIG. 17.

After completion of the above-described process steps, metal layers for forming the bond-assisting alloyed layers are formed respectively on the first main surface of the GaP light extraction layer 20 and on the second main surface of the GaP transparent substrate 90 by a sputtering or a vacuum deposition method as shown in STEP 7 in FIG. 18, and then annealed for alloying (so-called sintering) so as to form the bond-assisting alloyed layers 9a, 15c (see FIG. 1, not shown in FIG. 18). The light-extraction-area-side electrode 9 and the back electrode 15 are formed so as to cover the bond-assisting alloyed layers 9a and 15c, respectively, to thereby obtain a light emitting device wafer W.

Next, as shown in STEP 8, the main light extraction area ((100) main surface) of the GaP light extraction layer 20 is anisotropically etched using an etching solution FEA for surface roughening, to thereby form the surface roughening projections 40f. The etching solution for surface roughening is an aqueous solution containing acetic acid, hydrofluoric acid, nitric acid and iodine, and specifically contains:

acetic acid (on $CH_3COOH$ basis): 37.4% by mass or more and 94.8% by mass or less;

hydrofluoric acid (on HF basis): 0.4% by mass or more and 14.8% by mass or less;

nitric acid (on $HNO_3$ basis): 1.3% by mass or more and 14.7% by mass or less; and iodine (on $I_2$ basis): 0.12% by mass or more and 0.84% by mass or less, and has a water content of 2.4% by mass or more and 45% by mass or less, and more preferably contains:

acetic acid (on $CH_3COOH$ basis): 45.8% by mass or more and 94.8% by mass or less;

hydrofluoric acid (on HF basis): 0.5% by mass or more and 14.8% by mass or less;

nitric acid (on $HNO_3$ basis): 1.6% by mass or more and 14.7% by mass or less; and iodine (on $I_2$ basis): 0.15% by mass or more and 0.84% by mass or less, and has a water content of 2.4% by mass or more and 32.7% by mass or less. The solution temperature is appropriately adjusted to 40° C. to 60° C., both ends inclusive.

Figure 12:
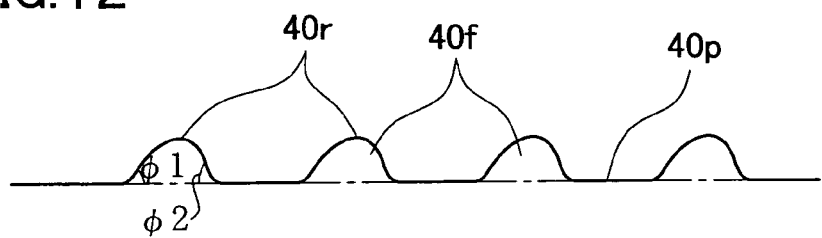
FIG. 12 is a third schematic drawing of the surface roughening projections.
Figure 13:
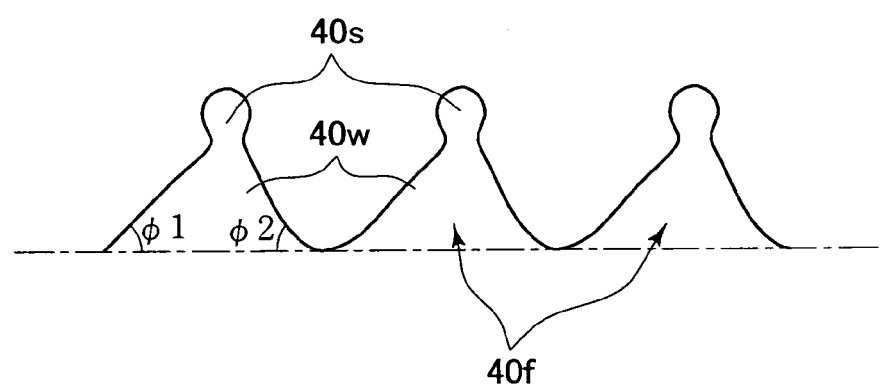
FIG. 13 is a fourth schematic drawing of the surface roughening projections.
Figure 24:
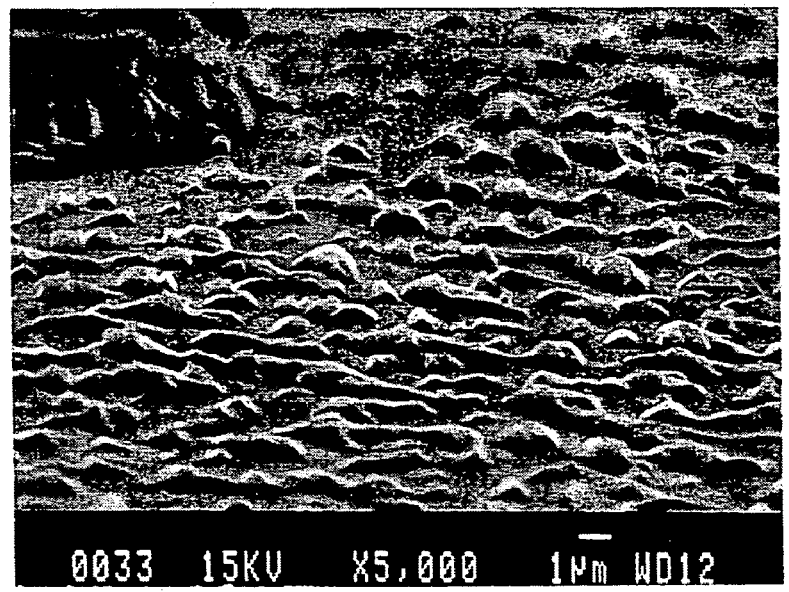
FIG. 24 is a SEM (scanning electron microscope) observed image showing a first exemplary observation of the surface roughening projections.
Figure 25:
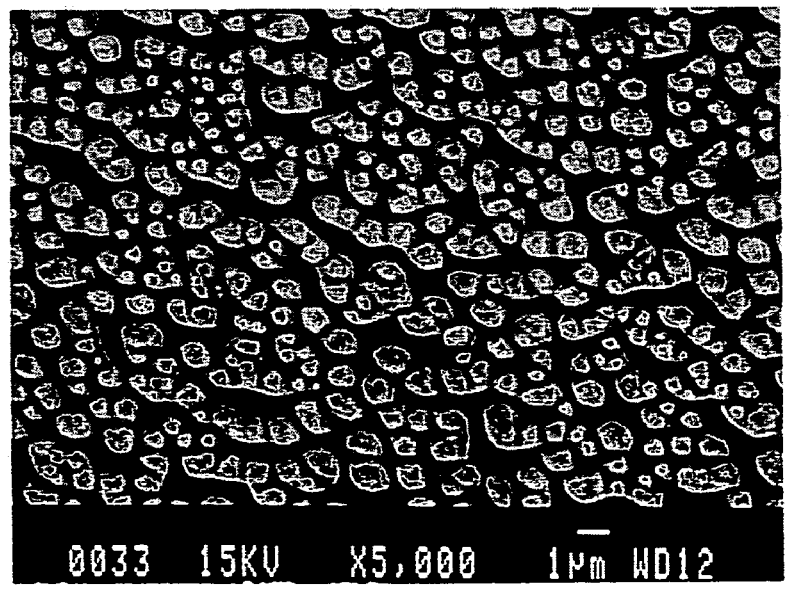
FIG. 25 is a SEM observed image showing a second exemplary observation of the surface roughening projections.

With progress of the anisotropic etching, the surface roughening projections formed on the flat (100) main surface of GaP gradually adds the depth of formation of the side faces of the pyramids composed of the {111} surface, while shrinking a flat area 40p between the projections, as shown in FIG. 12 and FIG. 13. In the early stage of this process, the projections show a rounded geometry in a form of having curved surfaces 40r on the end side thereof, as shown in FIG. 12. FIG. 24 and FIG. 25 are images observed under scanning electron microscope (×5000), showing a specific example of the formation, wherein FIG. 24 shows a perspective image, and FIG. 25 shows a plan image. The etching solution used herein contains 81.7% by mass of acetic acid, 5% by mass of hydrofluoric acid, 5% by mass of nitric acid and 0.3% by mass of iodine, with a water content suppressed to as low as 8% by mass. The solution temperature is 50° C. and etching time is 60 seconds. Assuming now the angle held between the curved surface 40r and the tangential plane as the angle of incidence of beam of emitted light, this geometry ensures a relatively large angle of incidence anywhere on the curved surface 40r, and can consequently raise the light extraction efficiency. The flat area 40p appropriately remaining between the projections makes it less likely to cause re-incidence of the beam of emitted light once extracted from one projection into the adjacent projection.

Figure 26:
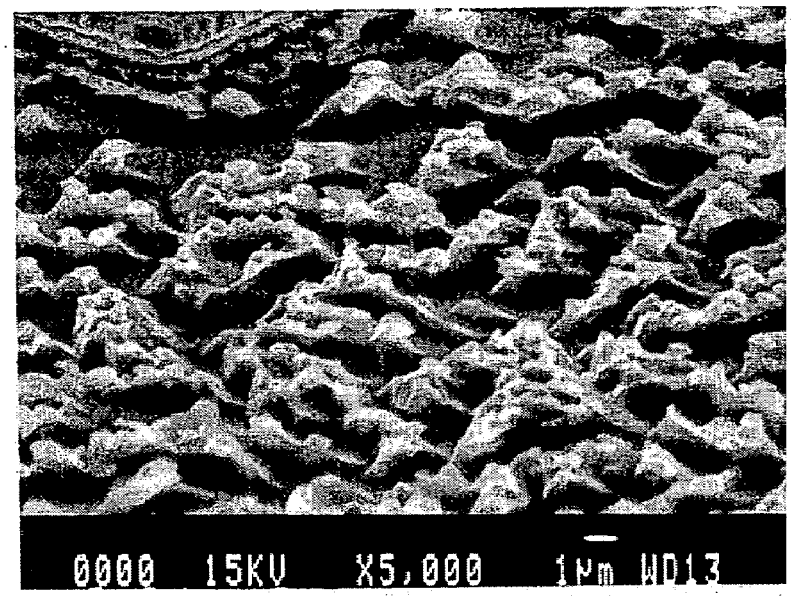
FIG. 26 is a SEM observed image showing a third exemplary observation of the surface roughening projections.
Figure 27:
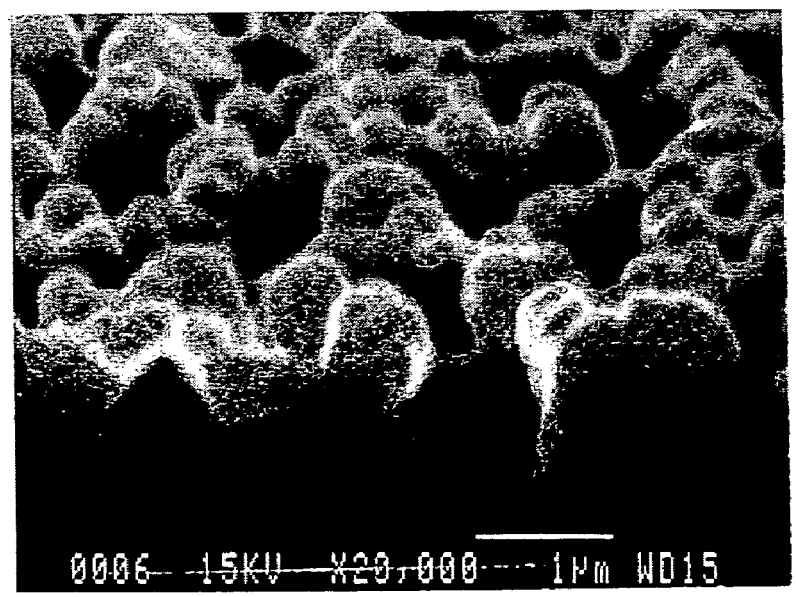
FIG. 27 is a SEM observed image showing a fourth exemplary observation of the surface roughening projections.

On the other hand, as the etching proceeds, the projections not only adds their height as shown in FIG. 13, but also causes changes in the geometry, appeared as having a main body 40w composing the base side of the projection and thinned towards the end side thereof, and a swelled tip portion 40s integrated with the main body 40w, as being swelled out in a ball form on the end side thereof. This geometry increases ratio of the inclined {111} surfaces composing the outer surface of the main body 40w, and the ball form of the swelled tip portion 40s approaches a sphere which is ideal for light extraction, ensuring a even better light extraction efficiency. FIG. 26 and FIG. 27 are images observed under scanning electron microscope, showing other specific examples of the formation, wherein FIG. 26 shows a perspective image (×5000), and FIG. 27 shows a sectional side elevation (×20000). The etching solution used herein contains 81.7% by mass of acetic acid, 5% by mass of hydrofluoric acid, 5% by mass of nitric acid and 0.3% by mass of iodine, with a water content suppressed to as low as 8% by mass. The solution temperature is 50° C. and etching time is 90 seconds.

Figure 5:
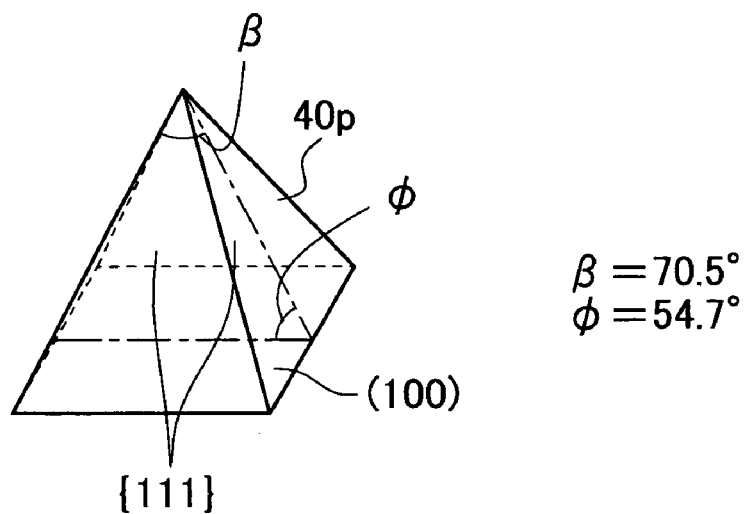
FIG. 5 is a conceptual drawing of a basic geometry of the surface roughening projection formed on the {100} base surface by anisotropic etching.
Figure 8:
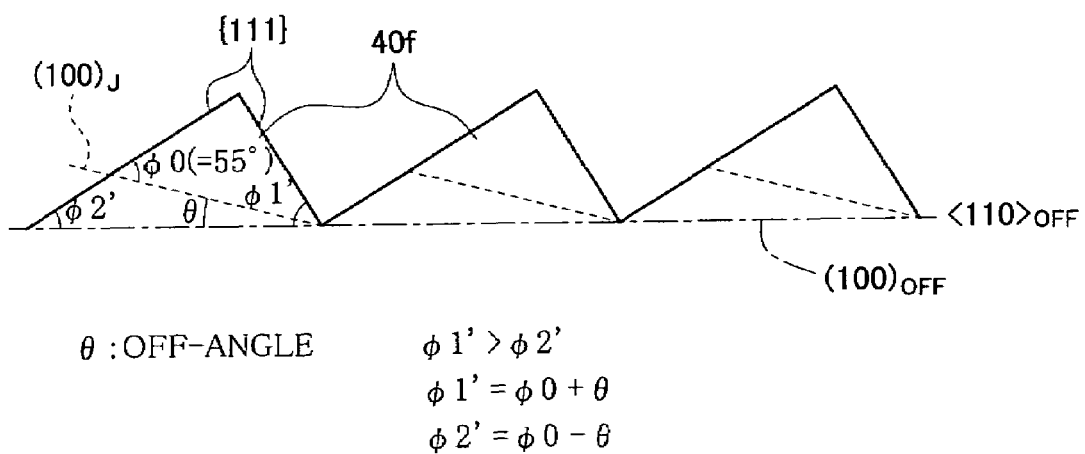
FIG. 8 is a second schematic drawing of the surface roughening projections.
Figure 9:
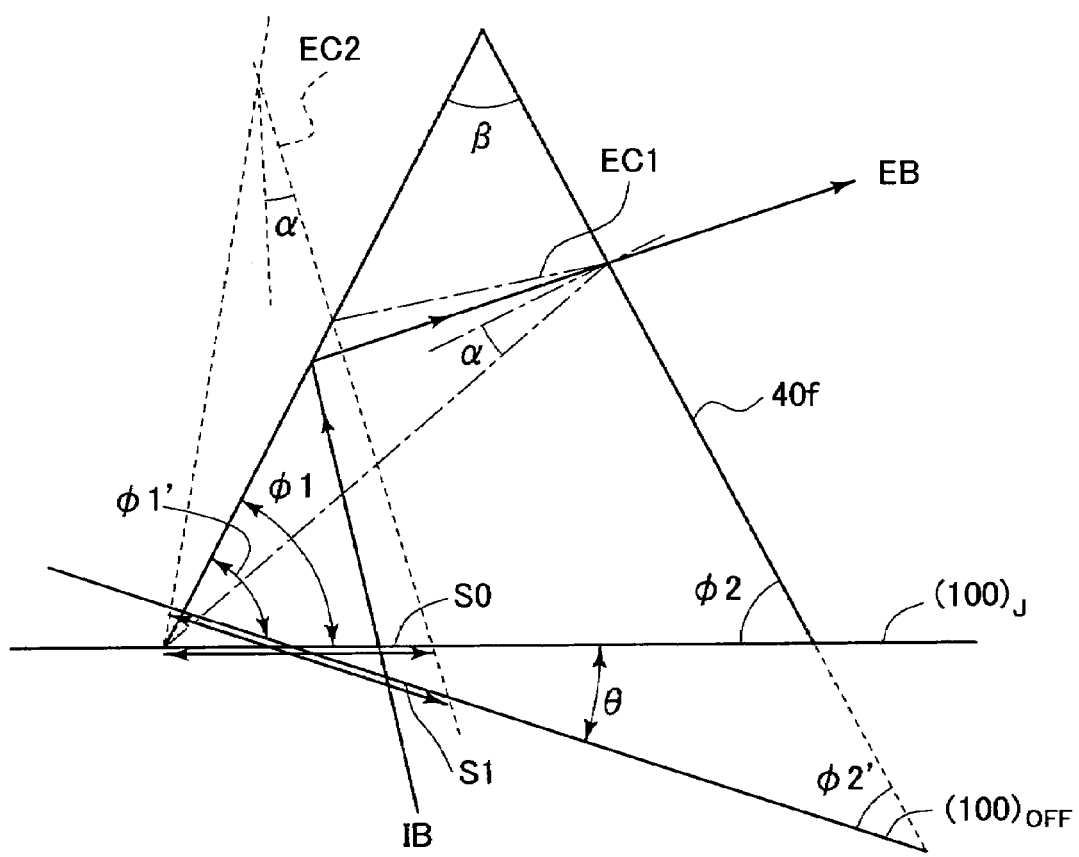
FIG. 9 is a drawing explaining a supposed principle of inclination-induced improvement in the light extraction efficiency of the surface roughening projection formed on the $\{100\}_{OFF}$ surface.
Figure 28:
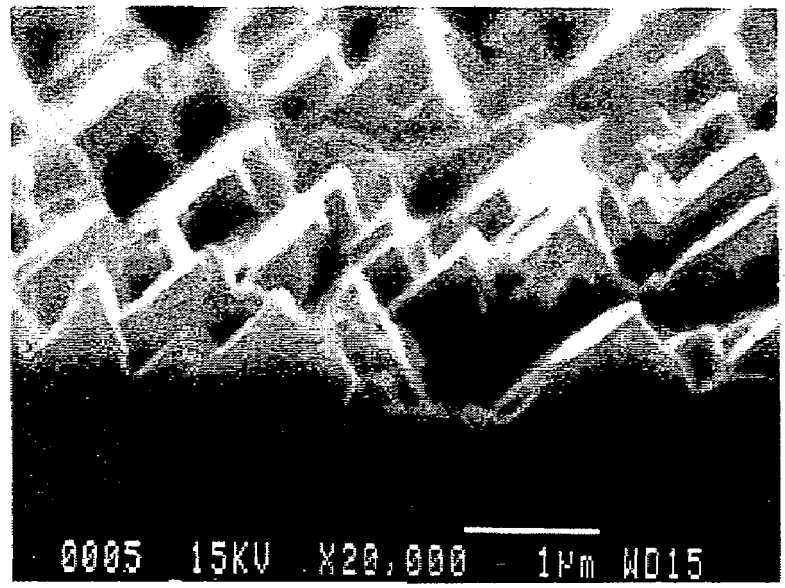
FIG. 28 is a SEM observed image showing a fifth exemplary observation of the surface roughening projections.
Figure 29:
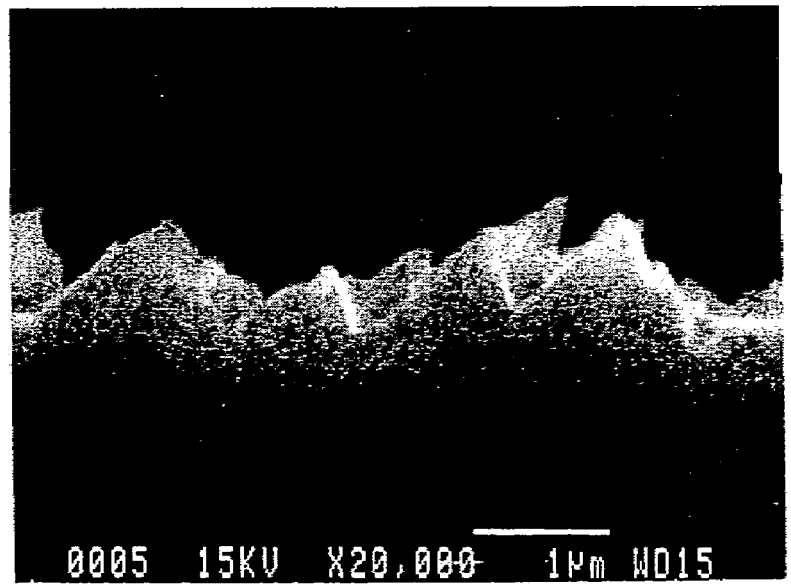
FIG. 29 is a SEM observed image showing a sixth exemplary observation of the surface roughening projections.

When the etching further proceeds thereafter, the swelled tip portions disappear as shown in FIG. 8, and almost entire portion of the side faces of the projections are occupied by the {111} surfaces, coming closer to a geometry of steeply-pointed pyramid (see also FIG. 5). This state ensures a largest density of formation and a largest height of the projections, and therefore realizes an excellent light extraction efficiency. FIG. 28 and FIG. 29 are images observed under scanning electron microscope, showing other specific examples of the formation, wherein FIG. 28 shows a perspective image (×20000), and FIG. 29 shows a sectional side elevation (×20000). The etching solution used herein contains 81.7% by mass of acetic acid, 5% by mass of hydrofluoric acid, 5% by mass of nitric acid and 0.3% by mass of iodine, with a water content suppressed to as low as 8% by mass. The solution temperature is 50° C. and etching time is 120 seconds.

Figure 7:
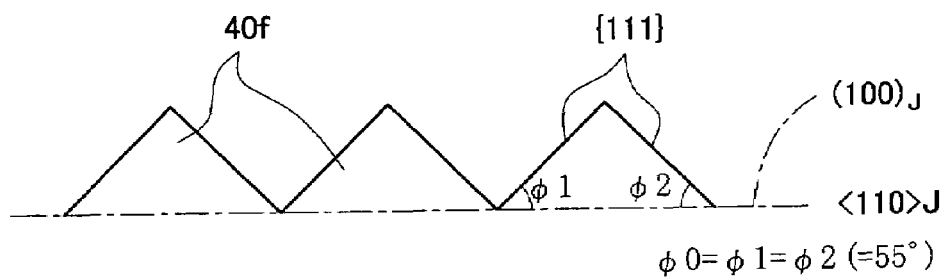
FIG. 7 is a first schematic drawing of the surface roughening projections.

When the $(100)_f$ surface appears on the first main surface of the GaP light extraction layer 20 (that is, when the off-angle θ is 0° in STEP 1 of FIG. 15), the obtained projections have a nearly upright semi-octahedral geometry as shown in FIG. 7, having angles φ1 and φ2 held between each of two opposing side faces and the $(100)_J$ surface equal to each other ($\phi1=\phi2=\phi0$; approximately 55°). However under provision of off-angle θ as shown in FIG. 8, also the $(100)_J$ surfaces incline at an angle of θ away from the first main surface $((100)_{OFF})$ of the GaP light extraction layer 20. As a consequence, in the direction of connecting the $[100]_J$ axis and the normal line on the first main surface of the GaP light extraction layer 20, angles $\phi1'$ and $\phi2'$ held between each of two opposing side faces and the $(100)_{OFF}$ surface appear that angle $\phi1'$ located in the direction of inclination of the normal line on the $(100)_J$ is larger than angle $\phi2'$ on the opposite side. This configuration contributes further improvement in the light extraction efficiency. When considered on the basis of angle $\phi0$ under an off-angle θ of 0°, provision of off-angle θ gives $\phi1'=\phi0+\theta$ and $\phi2'=\phi0-\theta$. An off-angle θ of 15°, for example, gives $\phi1'=70°$ or around and $\phi2'=40°$ or around, both being larger than 30°.

Referring now back to FIG. 18, after completion of formation of the surface roughening projections 40f in the main light extraction area, the wafer W is then diced in two <100> directions (where, inclination not larger than 25°, and preferably not larger than 15°, away from the <100>$_J$ surface also allowable) from the first main surface side thereof, using a dicing blade so as to form grooves DG for individualizing the chips. The direction of dicing agreed with the <100> direction makes cracking or chipping along the edges of the chip area less likely to occur. In the dicing, a process-induced damage layer 20D having a relatively high density of crystal defects is formed as shown in STEP 9 of FIG. 18. A large number of crystal defects contained in the process-induced damage layer 20D are causative of current leakage and scattering during current supply for light emission, so that, as shown in STEP 10, the process-induced damage layer 20D is removed by chemical etching using an etching solution DEA for damage removal. The etching solution DEA for damage removal used herein is an aqueous sulfuric acid/hydrogen peroxide solution. The aqueous solution adoptable herein is such as having a ratio-by-mass of mixing of (sulfuric acid):(hydrogen peroxide):(water)=20:1:1, and the solution temperature is adjusted to 30° C. to 70° C., both ends inclusive.

Figure 6:
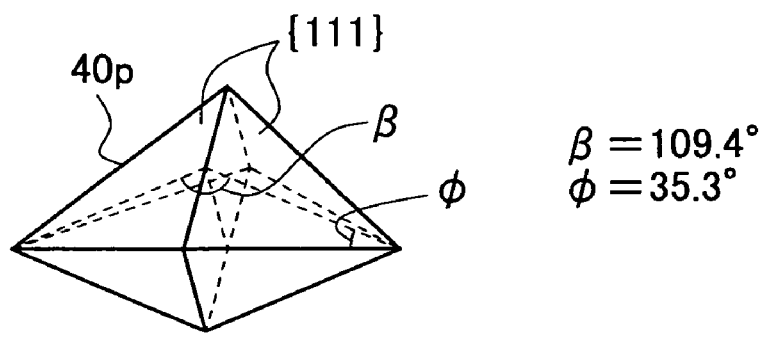
FIG. 6 is a conceptual drawing of a basic geometry of the surface roughening projection formed on the {110} base surface by anisotropic etching.
Figure 23:
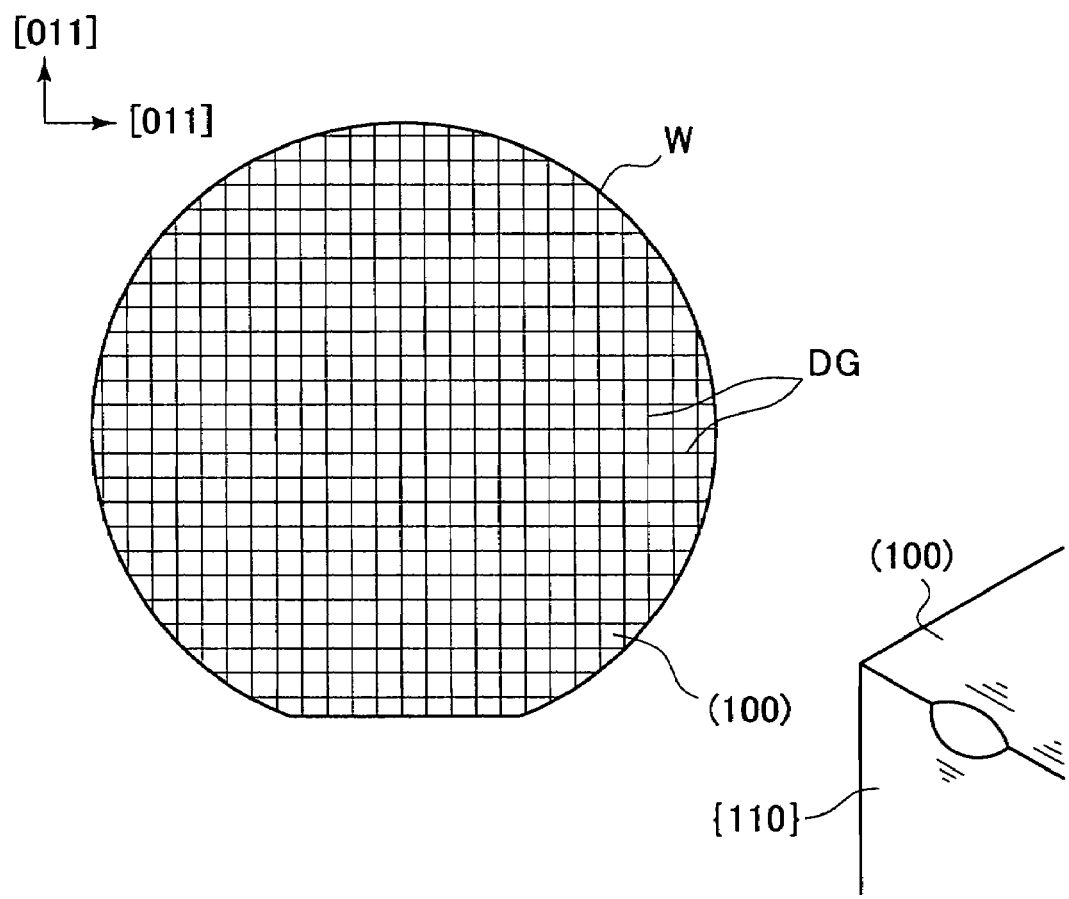
FIG. 23 is a drawing showing another exemplary setting of direction of dicing for fabricating the light emitting device shown in FIG. 1, together with a caution point.

The dicing direction may be set also in two <110> directions normal to each other, on the first main surface ((100) surface) of the wafer W as shown in FIG. 23. In this case, the side faces exposed by the dicing are given as the {110} surfaces, that is, given in a form agreed with the cleavage plane of the zincblende-type, III-V compound semiconductor crystal. By this setting, the individual chips 100C become less likely to cause chipping, and thereby the yield can be improved. It is, however, intrinsically difficult on the {110} surface to dramatically increase the height of the projections mainly composed of the {111} surfaces, as shown in FIG. 6, so that formation of the surface roughening projections using the above-described etching solution is less likely to proceed.

Thereafter, as shown in FIG. 11, the side faces of the chip after removal of the process-induced damage layer 20D is brought into contact with the etching solution FEA for surface roughening so as to anisotropically etch the side faces of the GaP light extraction layer 20, to thereby form the surface roughening projections 50f. In this embodiment, the wafer W is bonded to a base 60 while placing an adhesive sheet 61 in between, and fully diced in depth, so that the surface roughening projections 50f are formed also on the side faces of the GaP transparent substrate 90.

Figure 4:
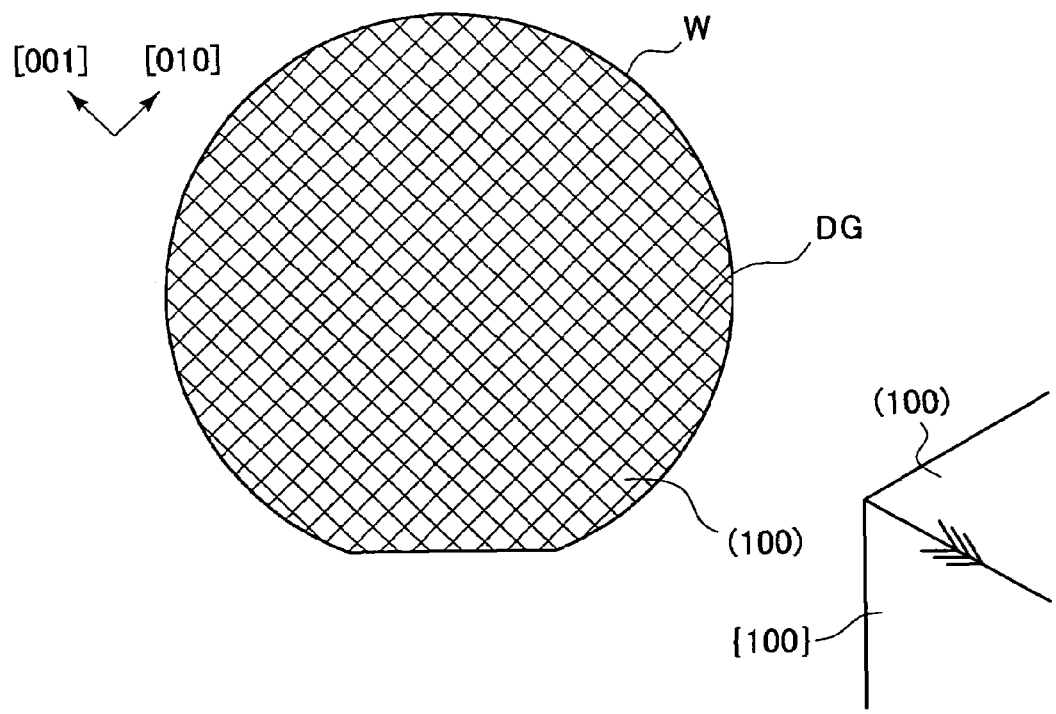
FIG. 4 is a drawing showing an exemplary setting of direction of dicing for fabricating the light emitting device shown in FIG. 1, together with an effect thereof.
Figure 30:
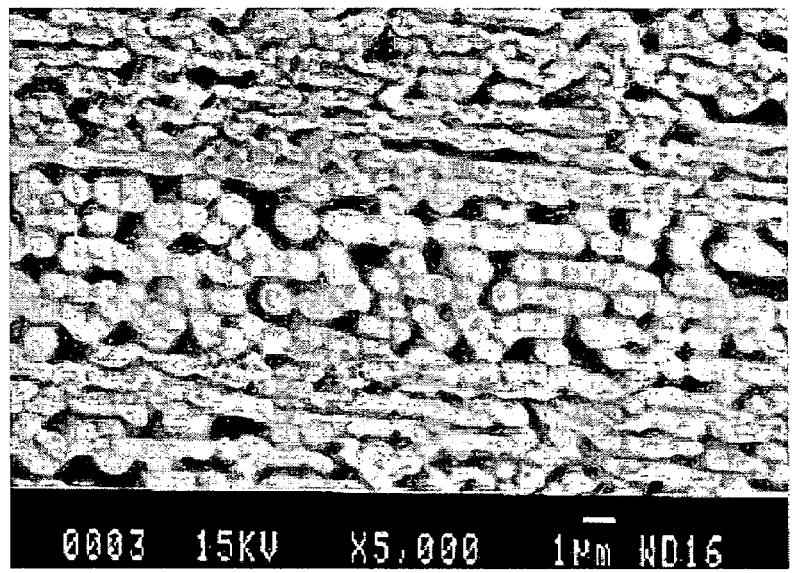
FIG. 30 is a SEM observed image showing a seventh exemplary observation of the surface roughening projections.
Figure 31:
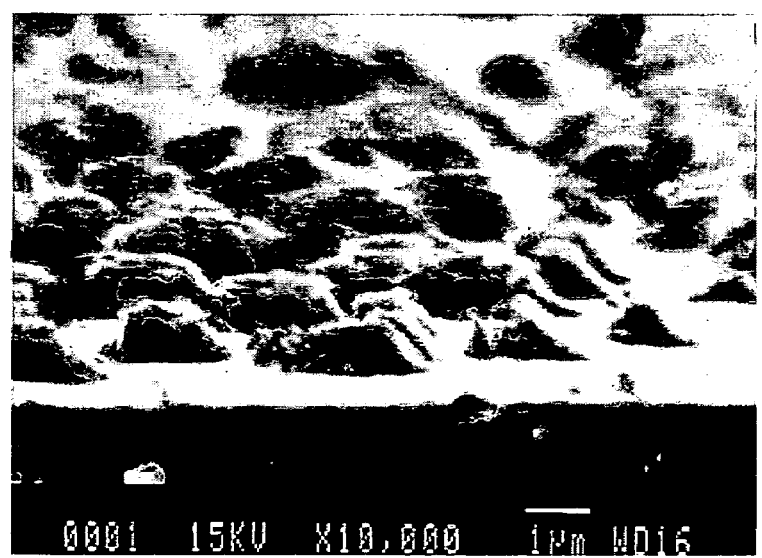
FIG. 31 is a SEM observed image showing an eighth exemplary observation of the surface roughening projections.

The side faces of the chip after the dicing may sometimes have a residual stress layer 20δ remained therein even after removal of the process-induced damage layer, and may thereby make it difficult to proceed thereon the anisotropic etching using the etching solution FEA for surface roughening. Whereas by dicing the wafer so as to expose the {100} surfaces on the side faces as shown in FIG. 4, distinctive projections can be formed as shown in FIG. 30 and FIG. 31 (FIG. 30 is a plan image at a 5000× magnification, and FIG. 31 is a perspective image at a 10000× magnification), although showing a slightly lower etchrate as compared with the main surface not affected by the dicing.

When it is desired to avoid influence of the etching possibly exerted on the main light extraction area 20p having the surface roughening projections 40f already formed thereon, in the process of forming the surface roughening projections 50f in the side-face light extraction areas 20S, it is preferable to mask the main light extraction area 20p with an etching resist 20M, as indicated by a dashed line in STEP 9 to STEP 11 of FIG. 18. It is also allowable to dice the wafer before the surface roughening projections 40f are formed on the main light extraction area 20p, and to form the surface roughening projections 40f and 50f at the same time in the main light extraction area 20p and in the side-face light extraction areas 20S.

Figure 14:
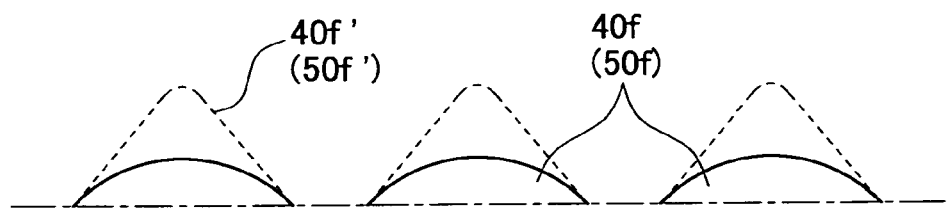
FIG. 14 is a fifth schematic drawing of the surface roughening projections.
Figure 32:
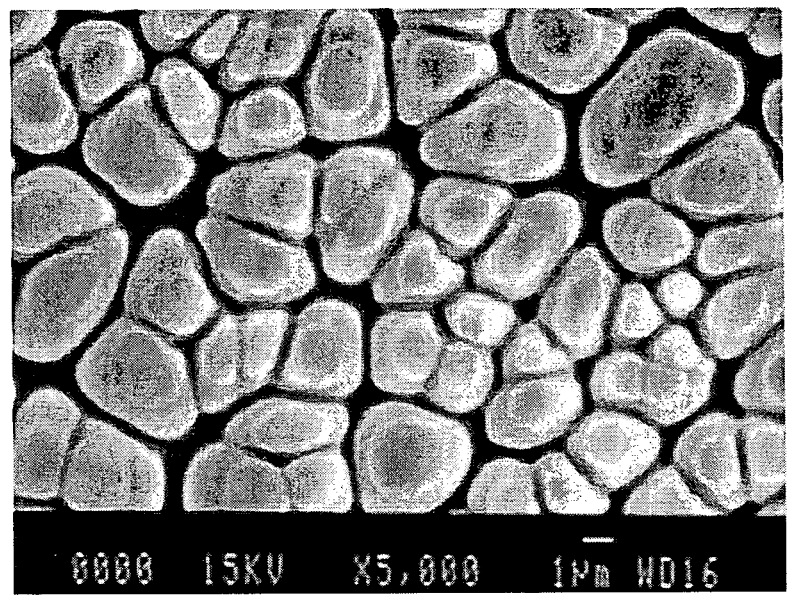
FIG. 32 is a SEM observed image showing a ninth exemplary observation of the surface roughening projections.
Figure 33:
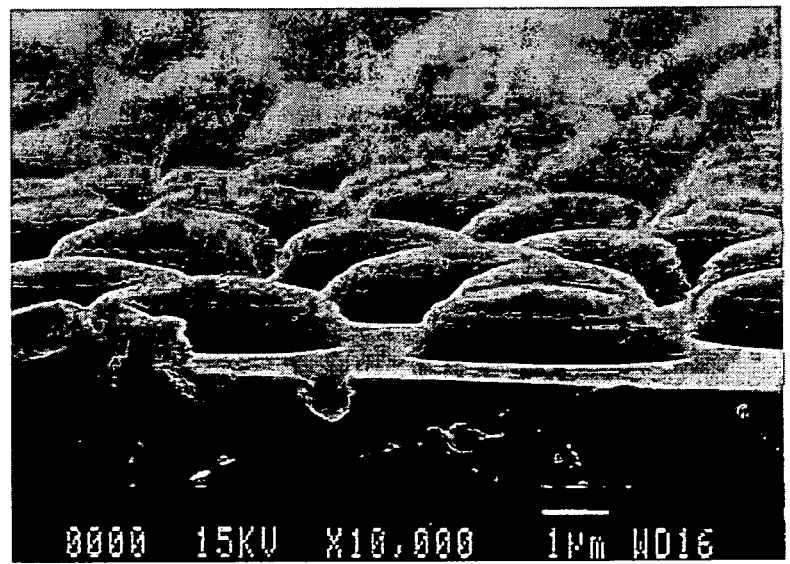
FIG. 33 is a SEM observed image showing a tenth exemplary observation of the surface roughening projections.
Figure 34:
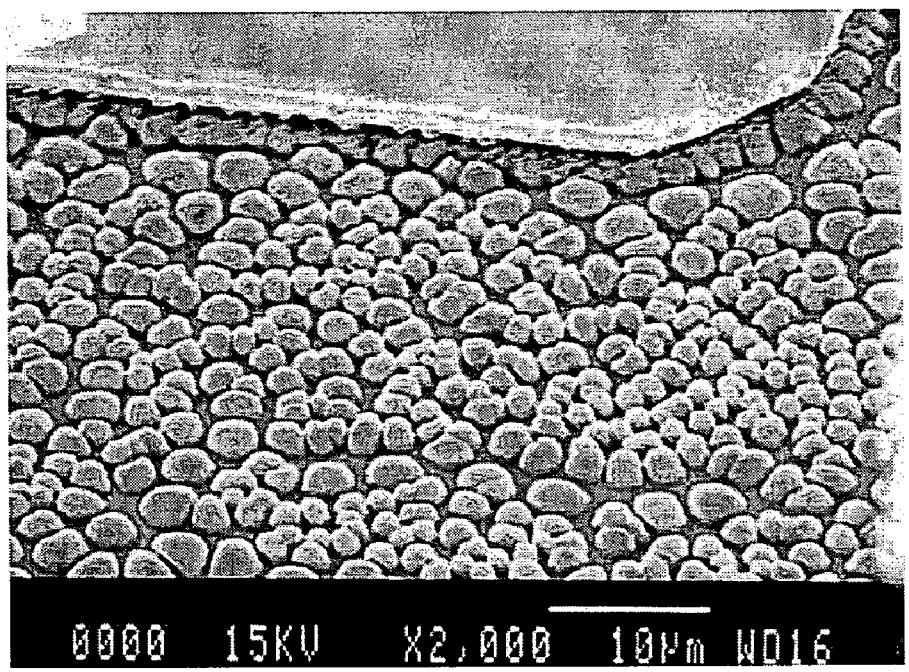
FIG. 34 is a SEM observed image showing an eleventh exemplary observation of the surface roughening projections.

In both of the main light extraction area 20p and the side-face light extraction areas 20S, the surface roughening projections 40f and 50f may be such as those having a basic geometry 40f' (50f') obtained by anisotropic etching as shown in FIG. 14, and further rounded using an isotropic etching solution, to thereby obtain the final forms of the surface roughening projections 40f (50f). The isotropic etching solution applicable herein is an aqueous sulfuric acid/hydrogen peroxide solution, similarly to the above-described etching solution for damage removal. FIG. 32 is a plan image showing an exemplary formation at a 5000× magnification, FIG. 33 is a perspective image at a 10000× magnification, and FIG. 34 is a perspective image at a 2000× magnification. Etching conditions involve an etching solution containing 81.7% by mass of acetic acid, 5% by mass of hydrofluoric acid, 5% by mass of nitric acid and 0.3% by mass of iodine, with a water content suppressed to as low as 8% by mass, a solution temperature of 50° C., and an etching time of 120 seconds for the preceding anisotropic etching; and an aqueous solution having a ratio-by-mass of mixing of (sulfuric acid):(hydrogen peroxide):(water)=20:1:1, a solution temperature of 50° C., and an etching time of 150 seconds for the succeeding isotropic etching.

The separated light emitting device chip is bonded, on the second main surface side thereof, to a metal stage while placing an Ag paste layer in between, followed by, as shown in FIG. 1, connection of a bonding wire 9w to the light-extraction-side electrode 9, and formation of an unillustrated mold portion composed of an epoxy resin, to thereby complete a final form of the light emitting device.

Figure 19:
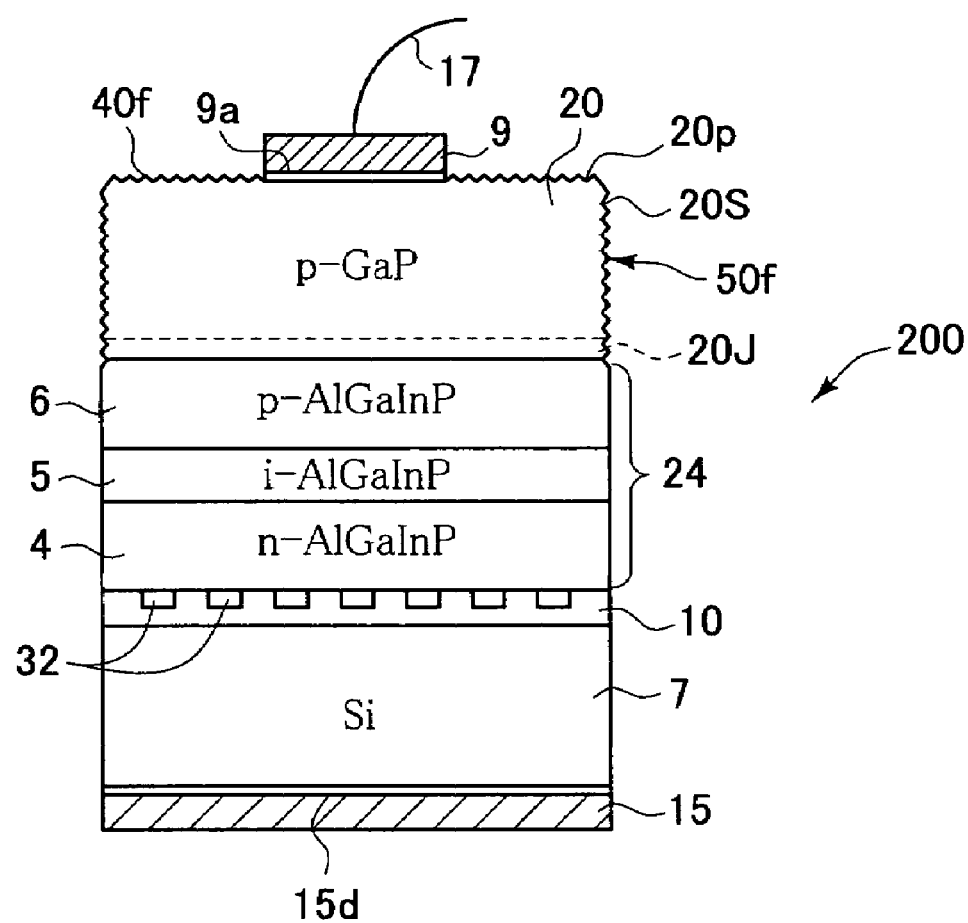
FIG. 19 is a schematic sectional side elevation showing a first modified example of the light emitting device shown in FIG. 1.

Paragraphs below will describe various modified examples of the light emitting device of this invention (any components identical to those in the light emitting device 100 shown in FIG. 1 will be given with the same reference numerals so as to avoid detailing, and only different aspects will be explained). A light emitting device 200 shown in FIG. 19 is configured as having a metal reflective layer 10 composed of Au or Ag (or any alloys having these elements as major components), in place of bonding the GaP transparent substrate 90 on the second main surface side of the light emitting layer section 24 of the light emitting device in FIG. 1. Beam of light emitted from the light emitting layer section 24 is reflected on the metal reflective layer 10 back towards the main light extraction area side, successfully realizing a light emitting device having a strong directionality on the main light extraction area side. In this embodiment, an electro-conductive Si substrate 7 is bonded to the second main surface of the light emitting layer section 24, while placing the metal reflective layer 10 in between. The Si substrate 7 has the back electrode 15 formed on the second main surface side thereof, wherein a bond-assisting layer 15d is formed in between over the entire second main surface of the Si substrate 7, because the back electrode 15 does not form a reflective surface. Between the metal reflective layer 10 and the light emitting layer section 24, a dot-patterned, bond-assisting alloyed layer 32 (typically composed of an AuGeNi alloy) is formed in a distributed manner.

Figure 20:
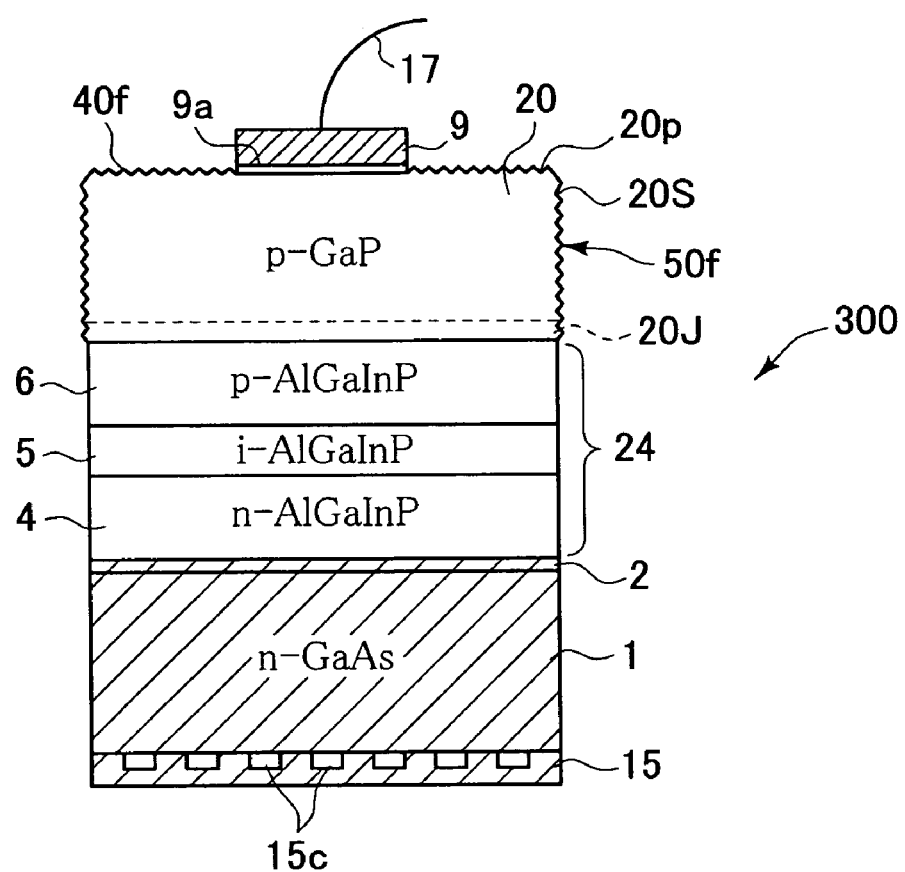
FIG. 20 is a schematic sectional side elevation showing a second modified example of the light emitting device shown in FIG. 1.
Figure 21:
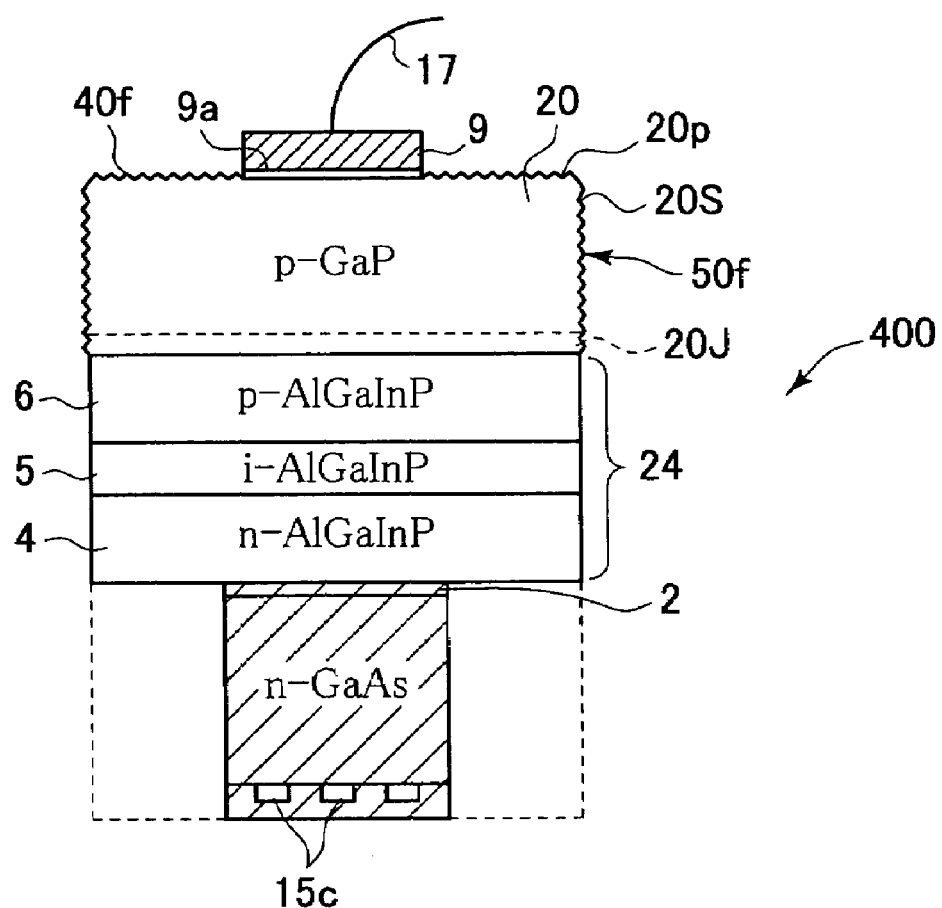
FIG. 21 is a schematic sectional side elevation showing a third modified example of the light emitting device shown in FIG. 1.

A light emitting device 300 exemplified in FIG. 20 dare uses the opaque GaAs substrate 1 directly as a device-forming substrate, rather than removing it. A light emitting device 400 exemplified in FIG. 21 has the GaAs substrate 1 cut off in the circumferential portion thereof so as to expose the circumferential portion of the light emitting layer section 24 on the second main surface side thereof, allowing extraction of light also through the exposed portion.

Figure 22:
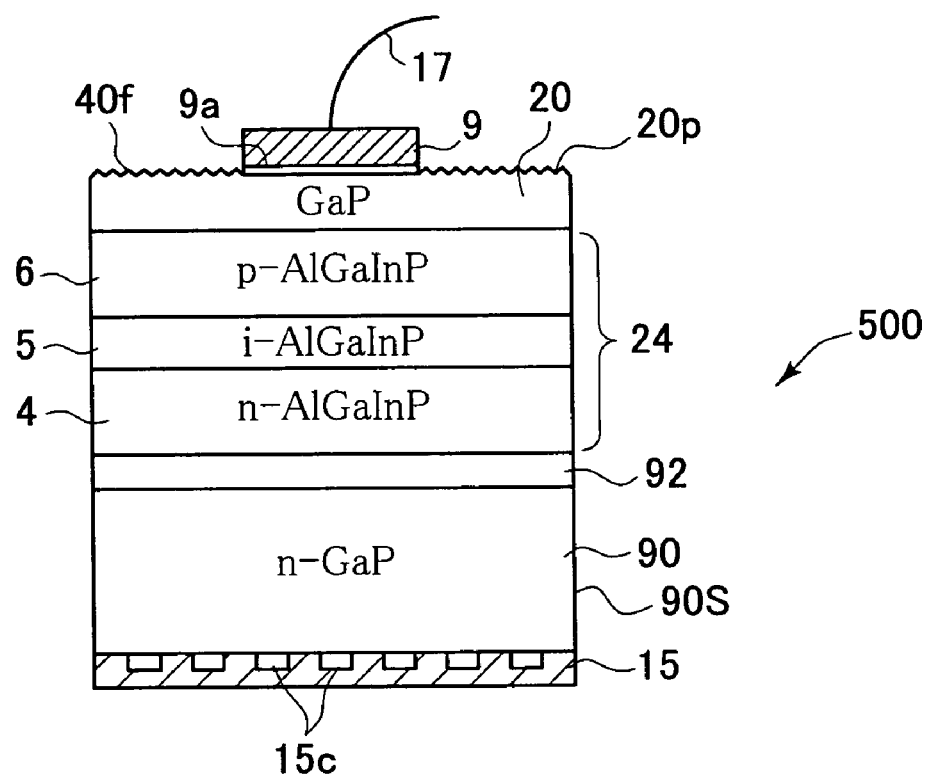
FIG. 22 is a schematic sectional side elevation showing another example of light emitting device possibly fabricated by the method of this invention.

A light emitting device 500 shown in FIG. 22 is thinned as a whole so as to enhance heat radiation effect, by setting the thickness of the GaP light extraction layer 20 to less than 40 μm, and further to as relatively small as 5 μm to 30 μm, both ends inclusive. The GaP light extraction layer 20 has the surface roughening projections 40f formed only on the main light extraction area 20p thereof, and has no surface roughening projections formed on the side faces thereof, because the GaP light extraction layer 20 has only a small thickness and shows only a less distinctive effect of allowing light extraction from the side faces, as compared with the light emitting device 100 shown in FIG. 1. In the process steps of fabricating thus-configured chip shown in FIG. 18, the formation of the surface roughening projection on the side faces shown in STEP 11 is omissible.

What is claimed is:

1. A method of fabricating a light emitting device comprising:
    a light emitting device wafer fabricating step fabricating a light emitting device wafer having a light emitting layer section based on a double heterostructure in which a first-conductivity-type cladding layer, an active layer and an second-conductivity-type cladding layer, each of which being composed of a compound semiconductor having a composition allowing lattice matching with GaAs, out of compound semiconductors expressed by formula $(Al_xGa_{1-x})In_{1-y}P$ (where $0 \leq x \leq 1$, $0 \leq y \leq 1$), are stacked in this order, and a GaP light extraction layer disposed on said light emitting layer section so as to allow a first main surface thereof to compose a first main surface of the wafer, so that the first main surface of said GaP light extraction layer appears as the (100) surface;
    a main light extraction area roughening step forming surface roughening projections on the first main surface of said GaP light extraction layer composed of said (100) surface, by etching said surface using an etching solution for surface roughening containing acetic acid, hydrofluoric acid, nitric acid, iodine and water up to a total content of 90% by mass or more, and having a total content by mass of acetic acid, hydrofluoric acid, nitric acid and iodine larger than the content by mass of water; and
    a dicing step dicing said light emitting device wafer to thereby fabricate light emitting device chips each having said surface roughening projections on the first main surface of said GaP light extraction layer.

2. The method of fabricating a light emitting device as claimed in claim 1, wherein said etching solution for surface roughening contains:
    acetic acid (on $CH_3COOH$ basis): 37.4% by mass or more and 94.8% by mass or less;
    hydrofluoric acid (on HF basis): 0.4% by mass or more and 14.8% by mass or less;
    nitric acid (on $HNO_3$ basis): 1.3% by mass or more and 14.7% by mass or less; and
    iodine (on $I_2$ basis): 0.12% by mass or more and 0.84% by mass or less,
    and has a water content of 2.4% by mass or more and 45% by mass or less.

3. The method of fabricating a light emitting device as claimed in claim 1, wherein said etching solution for surface roughening contains:
    acetic acid (on $CH_3COOH$ basis): 45.8% by mass or more and 94.8% by mass or less;
    hydrofluoric acid (on HF basis): 0.5% by mass or more and 14.8% by mass or less;
    nitric acid (on $HNO_3$ basis): 1.6% by mass or more and 14.7% by mass or less; and
    iodine (on $I_2$ basis): 0.15% by mass or more and 0.84% by mass or less,
    and has a water content of 2.4% by mass or more and 32.7% by mass or less.

4. The method of fabricating a light emitting device as claimed in claim 1, wherein said GaP light extraction layer is formed to be as thick as 10 μm or more on said light emitting device wafer, and
    further comprising a side-face light extraction area roughening step forming surface roughening projections on the side-face light extraction areas of said GaP light extraction layer composed of the side faces of the chips formed by said dicing, by etching said areas using said etching solution for surface roughening.

5. The method of fabricating a light emitting device as claimed in claim 4, wherein said dicing is carried out so that the {100} surface appears on the side faces of the chip.

6. The method of fabricating a light emitting device as claimed in claim 4, wherein said surface roughening projections are formed by removing, after said dicing step, a process-induced damage layer formed in said side-face light extraction areas of said GaP light extraction layer using an etching solution for removing damage composed of an aqueous sulfuric acid/hydrogen peroxide solution, and then by etching the exposed surface by said etching solution for surface roughening.

7. The method of fabricating a light emitting device as claimed in claim 6, wherein said GaP light extraction layer is formed to be as thick as 40 μm or more.

8. The method of fabricating a light emitting device as claimed in claim 1, wherein said GaP light extraction layer is formed to be thinner than 40 μm, and said surface roughening projections are not formed on the side faces of said GaP light extraction layer.

9. The method of fabricating a light emitting device as claimed in claim 1, wherein said surface roughening projections formed by an anisotropic etching using said etching solution for surface roughening are further rounded by etching using an isotropic etching solution.

* * * * *